US011448526B2

(12) United States Patent
Ishigami et al.

(10) Patent No.: US 11,448,526 B2
(45) Date of Patent: Sep. 20, 2022

(54) POSITION ESTIMATION METHOD, POSITION ESTIMATION DEVICE, AND MOTOR MODULE FOR ESTIMATING POSITION OF ROTOR IN MOTOR

(71) Applicant: NIDEC CORPORATION, Kyoto (JP)

(72) Inventors: Shota Ishigami, Kyoto (JP); Atsushi Fujita, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 50 days.

(21) Appl. No.: 16/976,761

(22) PCT Filed: Feb. 20, 2019

(86) PCT No.: PCT/JP2019/006383
§ 371 (c)(1),
(2) Date: Aug. 31, 2020

(87) PCT Pub. No.: WO2019/167763
PCT Pub. Date: Sep. 6, 2019

(65) Prior Publication Data
US 2021/0003422 A1 Jan. 7, 2021

(30) Foreign Application Priority Data
Mar. 2, 2018 (JP) ............................. JP2018-037414

(51) Int. Cl.
*G01D 5/14* (2006.01)
*G01B 7/30* (2006.01)
(Continued)

(52) U.S. Cl.
CPC .............. *G01D 5/145* (2013.01); *G01B 7/30* (2013.01); *G01R 15/202* (2013.01); *G01R 19/0092* (2013.01); *H02P 6/16* (2013.01)

(58) Field of Classification Search
None
See application file for complete search history.

(56) References Cited

U.S. PATENT DOCUMENTS 10,505,478 B2 12/2019 Fujita et al.
2013/0106326 A1* 5/2013 Kamatani ................ H02P 6/16
318/400.06

(Continued)

FOREIGN PATENT DOCUMENTS

JP 200835623 A 2/2008

OTHER PUBLICATIONS

International Search Report in PCT/JP2019/006383, dated May 28, 2019. 3pp.

*Primary Examiner* — Douglas X Rodriguez
(74) *Attorney, Agent, or Firm* — Hauptman Ham, LLP

(57) ABSTRACT

A position estimation method of the present disclosure includes: acquiring learning data from a storage medium that stores the learning data including a sequence of a plurality of measurement values which define a waveform characteristic of a first electrical signal output from a sensor device when a rotor R is rotating; acquiring a sequence of a plurality of detection values which define a waveform characteristic of a second electrical signal output from the sensor device when the rotor starts rotating from a stopped state; and performing matching between an increase/decrease pattern of the sequence of the plurality of measurement values and an increase/decrease pattern of the sequence of the plurality of detection values to estimate a relationship between a rotation position of the rotor when the first electrical signal is output and a rotation position of the rotor when the second electrical signal is output.

14 Claims, 10 Drawing Sheets

(51) Int. Cl.
*G01R 15/20* (2006.01)
*G01R 19/00* (2006.01)
*H02P 6/16* (2016.01)

(56) References Cited

U.S. PATENT DOCUMENTS

| | | | |
|---|---|---|---|
| 2014/0361715 A1* | 12/2014 | Murata | H02P 6/17 318/400.02 |
| 2017/0343382 A1 | 11/2017 | Fukumura et al. | |
| 2019/0003856 A1 | 1/2019 | Kawakami et al. | |

* cited by examiner

POSITION ESTIMATION METHOD, POSITION ESTIMATION DEVICE, AND MOTOR MODULE FOR ESTIMATING POSITION OF ROTOR IN MOTOR

CROSS-REFERENCE TO RELATED APPLICATIONS

This is the U.S. national stage of application No. PCT/JP2019/006383, filed on Feb. 20, 2019, and priority under 35 U.S.C. § 119(a) and 35 U.S.C. § 365(b) is claimed from Japanese Application No. 2018-037414, filed on Mar. 2, 2018.

FIELD OF THE INVENTION

The present application relates to a position estimation method and a position estimation device. The present application also relates to a motor module including a signal processing circuit that performs position estimation.

BACKGROUND

Motors such as permanent magnet synchronous motors generally include a rotor having a plurality of magnetic poles, a stator having a plurality of windings, and a sensor device outputting an electrical signal that periodically changes according to the rotation of the rotor. When it is necessary to measure a rotation angle (position) of the rotor with high resolution, position sensors such as a rotary encoder and a resolver are used. These position sensors make it difficult to reduce a size of a motor module and increase its manufacturing cost.

There is a method and a device that can detect a position of a rotor with high precision without using a special position sensor. There is also a method of estimating an initial position of the rotor (an angle position of the rotor in terms of a mechanical angle) when a motor is started after reactivation of power. The entire content disclosed above is incorporated herein.

According to the method of estimating the initial position of the rotor described above, an error between data acquired after activation of the power and data acquired in advance is calculated, and the initial position of the rotor is determined based on a rotor position that minimizes an accumulated value of the errors.

SUMMARY

In an exemplary embodiment, a position estimation method of the present disclosure is a position estimation method of estimating a rotation position of a rotor in a motor, which includes: the rotor having a plurality of magnetic poles; a stator having a plurality of windings; and a sensor device outputting an electrical signal that periodically changes according to rotation of the rotor, and includes: acquiring learning data from a storage medium that stores the learning data including a sequence of a plurality of measurement values which define a waveform characteristic of a first electrical signal output from the sensor device when the rotor is rotating; acquiring a sequence of a plurality of detection values which define a waveform characteristic of a second electrical signal output from the sensor device when the rotor starts rotating from a stopped state; and performing matching between an increase/decrease pattern of the sequence of the plurality of measurement values and an increase/decrease pattern of the sequence of the plurality of detection values to estimate a relationship between a rotation position of the rotor when the first electrical signal is output and a rotation position of the rotor when the second electrical signal is output.

In an exemplary embodiment, a position estimation device of the present disclosure is a position estimation device that is used by being connected to a motor, which includes: a rotor having a plurality of magnetic poles; a stator having a plurality of windings; and a sensor device outputting an electrical signal that periodically changes according to rotation of the rotor, and includes: a signal processing circuit; and a storage medium that stores learning data including a sequence of a plurality of measurement values which define a waveform characteristic of a first electrical signal output from the sensor device when the rotor is rotating. The signal processing circuit executes: acquiring a sequence of a plurality of detection values which define a waveform characteristic of a second electrical signal output from the sensor device when the rotor starts rotating from a stopped state; and performing matching between an increase/decrease pattern of the sequence of the plurality of measurement values and an increase/decrease pattern of the sequence of the plurality of detection values to estimate a relationship between a rotation position of the rotor when the first electrical signal is output and a rotation position of the rotor when the second electrical signal is output.

In an exemplary embodiment, a motor module of the present disclosure includes: a motor that includes a rotor having a plurality of magnetic poles and a stator having a plurality of windings; a sensor device that includes N sensor elements arranged such that phases are shifted by an angle of 360 degrees/N, the N sensor elements being N sensors detecting magnetic fields formed by the plurality of magnetic poles and outputting an electrical signal having a magnitude in response to an intensity of each of the detected magnetic fields; a signal processing circuit; and a storage medium that stores learning data including a sequence of a plurality of measurement values which define a waveform characteristic of a first electrical signal output from the sensor device when the rotor is rotating. The signal processing circuit executes: acquiring a sequence of a plurality of detection values which define a waveform characteristic of a second electrical signal output from the sensor device when the rotor starts rotating from a stopped state; and performing matching between an increase/decrease pattern of the sequence of the plurality of detection values and an increase/decrease pattern of the sequence of the plurality of measurement values to estimate a relationship between an initial rotation position of the rotor when the first electrical signal is output and an initial rotation position of the rotor when the second electrical signal is output.

The above and other elements, features, steps, characteristics and advantages of the present disclosure will become more apparent from the following detailed description of the preferred embodiments with reference to the attached drawings.

DETAILED DESCRIPTION

Figure 1:
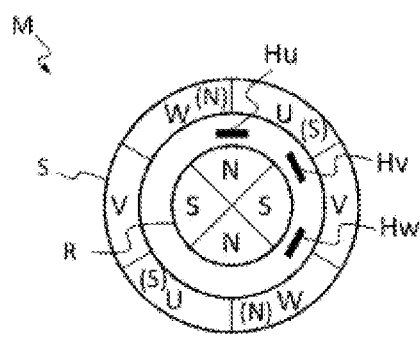
FIG. 1 is a view schematically illustrating a configuration example of a cross section perpendicular to a center axis of rotation of an exemplary motor M.

In a non-limiting exemplary embodiment, a position estimation method of the present disclosure estimates a rotation position of a rotor in a motor including the rotor having a plurality of magnetic poles and a stator having a plurality of windings. This motor further includes a sensor device outputting an electrical signal that periodically changes according to the rotation of the rotor. A typical example of the sensor device is a non-contact magnetic sensor, such as a Hall element, which converts a magnetic field generated in the motor into an electrical signal and outputs the electrical signal.

This position estimation method includes the following processes (1) to (3).

Process (1): Learning data is acquired from a storage medium that stores the learning data including a sequence of a plurality of measurement values, which define a waveform characteristic of an electrical signal (first electrical signal) output from the sensor device when the rotor is rotating. Such learning data can be acquired during an offline operation, for example, before the motor is shipped from a factory, and can be stored in a recording medium. Therefore, the sequence of the plurality of measurement values which define the waveform characteristic of the first electrical signal may be referred to as an "offline measurement value". An example of the sequence of the plurality of measurement values which define the waveform characteristic of the electrical signal, that is, an array of numerical values will be described below.

Process (2): A sequence of a plurality of detection values, which define a waveform characteristic of a second electrical signal output from the sensor device when the rotor starts rotating from a stopped state, is acquired. Typically, these detection values can be acquired immediately after a user of the motor reactivates the power to start the motor. Therefore, the sequence of the plurality of detection values which define the waveform characteristic of the second electrical signal may be referred to as an "online detection value".

Process (3): Matching is performed between an increase/decrease pattern of the sequence of the plurality of measurement values and an increase/decrease pattern of the sequence of the plurality of detection values. Through such pattern matching, a relationship between a rotation position of the rotor when the first electrical signal is output and a rotation position of the rotor when the second electrical signal is output is estimated.

The above processes can be executed by a position estimation device that includes a signal processing circuit and the storage medium storing the learning data including the sequence of the plurality of measurement values which define the waveform characteristic of the first electrical signal output from the sensor device when the rotor is rotating. Specifically, the signal processing circuit that constitutes the position estimation device executes the above processes.

Next, a specific example of each of the above processes will be described with reference to the drawings.

FIG. 1 schematically illustrates a configuration example of a cross section perpendicular to a center axis of rotation of an exemplary motor M. The motor M is a permanent magnet synchronous motor of an inner rotor type, but may be of an outer rotor type. The illustrated motor M includes a rotor R having four magnetic poles (the number of magnetic pole pairs is two) and a stator S having three-phase windings U, V, and W. The motor M further includes three Hall sensors Hu, Hv, and Hw that output electrical signals changing periodically according to the rotation of the rotor R. In the example of FIG. 1, the Hall sensors Hu, Hv, and Hw are arranged such that phases of detection signals obtained from these Hall sensors are shifted by 120 degrees (=360 degrees/3) in terms of electrical angle.

When focusing on one Hall sensor Hu for simplicity, an intensity of a magnetic field applied to the Hall sensor Hu by the magnetic poles of the rotor R changes periodically according to the rotation of the rotor R. While the rotor R rotates 360 degrees in terms of mechanical angle, a magnetic field that changes sinusoidally in a cycle corresponding to the number of magnetic pole pairs is applied to the Hall sensor Hu.

Similarly to the Hall sensor Hu, magnetic fields each changing sinusoidally in a cycle corresponding to the number of magnetic pole pairs are also applied to the other Hall sensors Hv and Hw from the magnetic poles of the rotating rotor R. The individual Hall sensors Hu, Hv, and Hw sense the magnetic fields created by the magnetic poles of the rotor R at different positions, respectively, and thus, output the electrical signals whose phases are mutually shifted by 120 degrees in terms of electrical angle. Further, the Hall sensors Hu, Hv, and Hw generally have mutually different sensitivities, and thus, can output the electrical signals having different magnitudes even if receiving the magnetic field created by the magnetic poles of the rotating rotor R in the same manner. Furthermore, even positions of the Hall sensors Hu, Hv, and Hw do not always match design positions without any error. Therefore, the phases of the electrical signals obtained from the Hall sensors Hu, Hv, and Hw are not always shifted exactly by 120 degrees.

Figure 2:
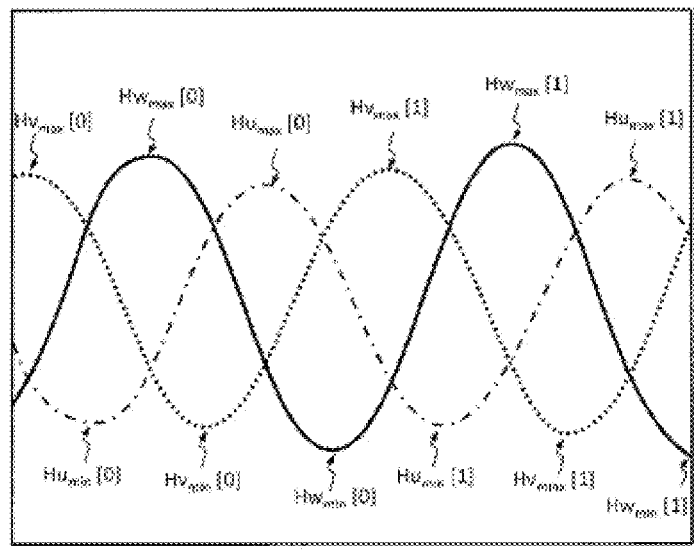
FIG. 2 is a graph illustrating examples of waveforms of electrical signals acquired from Hall sensors Hu, Hv, and Hw.

FIG. 2 is a graph illustrating examples of waveforms of the electrical signals acquired from the Hall sensors Hu, Hv, and Hw. The electrical signal from the Hall sensor Hu is indicated by a one-dot chain line, the electrical signal from the Hall sensor Hv is indicated by a dotted line, and the electrical signal from the Hall sensor Hw is indicated by a solid line. Maximum values of the respective electrical signals are denoted by signs of $Hv_{max}[0]$, $Hw_{max}[0]$, $Hu_{max}[0]$, $Hv_{max}[1]$, $Hw_{max}[1]$, and $Hu_{max}[1]$ in order from the left side of FIG. 2. Minimum values of the respective electrical signals are denoted by signs of $Hu_{min}[0]$, $Hv_{min}[0]$, $Hw_{min}[0]$, $Hu_{min}[1]$, $Hv_{min}[1]$, and $Hw_{min}[1]$ in order from the left side of FIG. 2.

Ideally, the minimum values and maximum values of these electrical signals have the same magnitudes, respectively. In reality, however, the minimum values and maximum values of the electrical signals may have different magnitudes as illustrated in FIG. 2, for the above-described reason and the like.

Each of three curves illustrated in FIG. 2 corresponds to a periodic fluctuation for two cycles. Such a periodic fluctuation for two cycles is implemented as the rotor R rotates 360 degrees in terms of mechanical angle in the motor M illustrated in FIG. 1. For example, the two maximum values $Hw_{max}[0]$ and $Hw_{max}[1]$ indicated by the electrical signal obtained from the Hall sensor Hv have mutually different magnitudes. This means that the plurality of magnetic poles of the rotor R respectively apply magnetic fields having different magnitudes to the Hall sensor Hv. The plurality of magnetic poles of the rotor R can apply the magnetic fields having the different magnitudes to the Hall sensor Hu, Hv or Hw due to manufacturing variations of a permanent magnet and/or the rotor R. Therefore, a waveform pattern of the electrical signal illustrated in FIG. 2 differs for each motor.

Next, when the number of magnetic pole pairs of the rotor increases, the number of maximum values and minimum values of the electrical signal obtained during the rotation at 360 degrees in terms of mechanical angle increases. When the number of magnetic pole pairs is an integer N, the number of maximum values of the electrical signal acquired from one Hall sensor during the rotation at 360 degrees in terms of mechanical angle is N.

Hereinafter, an example of measuring maximum values of an electrical signal acquired from one Hall sensor will be described. In this example, the maximum values of the electrical signal acquired from a certain Hall sensor are measured for a motor having six magnetic pole pairs.

Figure 3A:
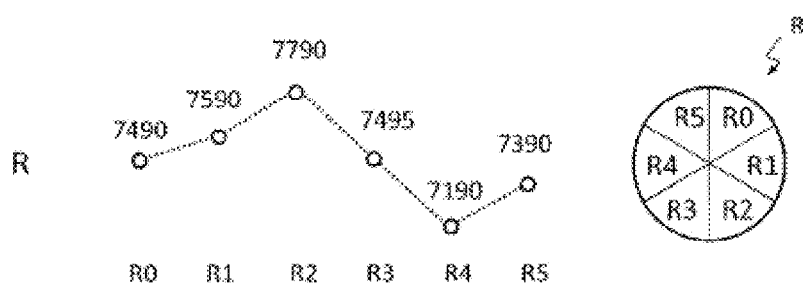
FIG. 3A is a view illustrating an example of a sequence of a plurality of measurement values of an electrical signal output from one Hall sensor when a rotor R having six magnetic pole pairs makes one turn in terms of mechanical angle.

FIG. 3A illustrates an example of a sequence of a plurality of measurement values of an electrical signal output from one Hall sensor when the rotor R having six magnetic pole pairs makes one turn in terms of mechanical angle. This sequence (array) of numerical values is a sequence of the maximum values of the electrical signal, and defines a waveform characteristic of the electrical signal. As the waveform characteristic of the electrical signal, a minimum value may be adopted instead of the maximum value or together with the maximum value. In FIG. 3A, as an example, six white circles indicating a numerical sequence of 7490, 7590, 7790, 7495, 7190, and 7390 are described. The sequence of these numerical values can constitute at least a part of the learning data in the above-described process (1).

FIG. 3A also illustrates a schematic cross-sectional view of the rotor R having six magnetic pole pairs R0, R1, R2, R3, R4, and R5 for reference. In this example, when the rotor R rotates, the magnetic pole pairs R0, R1, R2, R3, R4, and R5 sequentially apply magnetic fields to one Hall sensor of interest, and as a result, six maximum values are generated in the electrical signal acquired from this Hall sensor. In the example of FIG. 3, the six maximum values (white circles) and the six magnetic pole pairs (R0 to R5) are associated with one another. When the rotation of the rotor R is started, the maximum value 7490 that appears first can be associated with the magnetic pole pair R0. Note that each of these numerical values may be an average of measurement values acquired when the rotor R rotates a plurality of times in terms of mechanical angle. Specifically, when N is an integer of two or more, a value, obtained by dividing the sum of N maximum values acquired from the magnetic pole pair R0 by N while the rotor R is rotating 360 degrees N times in terms of mechanical angle, may be held as the "maximum value" of the magnetic pole pair R0.

The six magnetic pole pairs (R0 to R5) also cause the other Hall sensors to generate electrical signals periodically changing in a sinusoidal manner. Based on these electrical signals, it is possible to acquire sequences of maximum values and/or minimum values in the same manner. Even if the magnetic pole pairs (R0 to R5) are the same, the waveforms of the electrical signals may be different due to individual differences in sensitivity, fixed position, fixed angle, and the like among the individual Hall sensors. As a result, the waveform characteristic of each electrical signal may also differ for each Hall sensor. The learning data may include various numerical sequences based on the electrical signals output from the plurality of sensors.

Figure 3B:
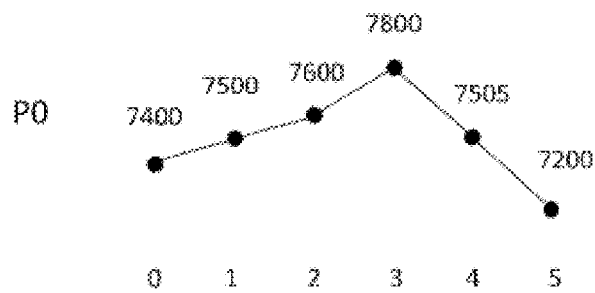
FIG. 3B is a view illustrating an example of a sequence of a plurality of detection values.

FIG. 3B illustrates an example of the sequence of the plurality of detection values obtained by the above-described process (2). In other words, an array of six numerical values illustrated in FIG. 3B is a sequence of maximum values of the electrical signal (second electrical signal) output from the one Hall sensor when the rotor starts rotating from a stopped state after the restart of the motor. This sequence (array) of numerical values defines the waveform characteristic of the "second electrical signal". FIG. 3B illustrates the sequence of six numerical values (maximum values) from "0" to "5", that is, 7400, 7500, 7600, 7800, 7505, and 7200.

The sequence of the maximum values of detection values in FIG. 3B is not the same as the sequence of the maximum values of the measurement values in FIG. 3A. This is because the waveform of the electrical signal illustrated in FIG. 2 differs between the process (1) and the process (2). The main factor that causes a difference between phases of the waveforms of the electrical signals acquired from the exact same rotor R is a difference in orientation of the rotor R when the rotor R starts rotating, that is, position of the magnetic pole pair of the rotor R is different between the process (1) and the process (2). A factor that causes a difference between numerical values defining the waveform characteristics of the electrical signals may be a variation in environmental temperature and/or characteristic of the Hall sensor between the process (1) and the process (2).

In the position estimation method of the present disclosure, pattern matching is performed between the array of the measurement values illustrated in FIG. 3A and the array of the detection values illustrated in FIG. 3B, thereby detecting a phase difference (angle difference) between the array of measurement values and the array of detection values. Based on this phase difference, it is possible to know a direction of a current rotor rotation start position relative to a rotor rotation start position at the time of acquiring the learning data.

The above pattern matching can be executed by various methods. An example of a method that can be adopted in the embodiment of the present disclosure will be described hereinafter.

Figure 4:
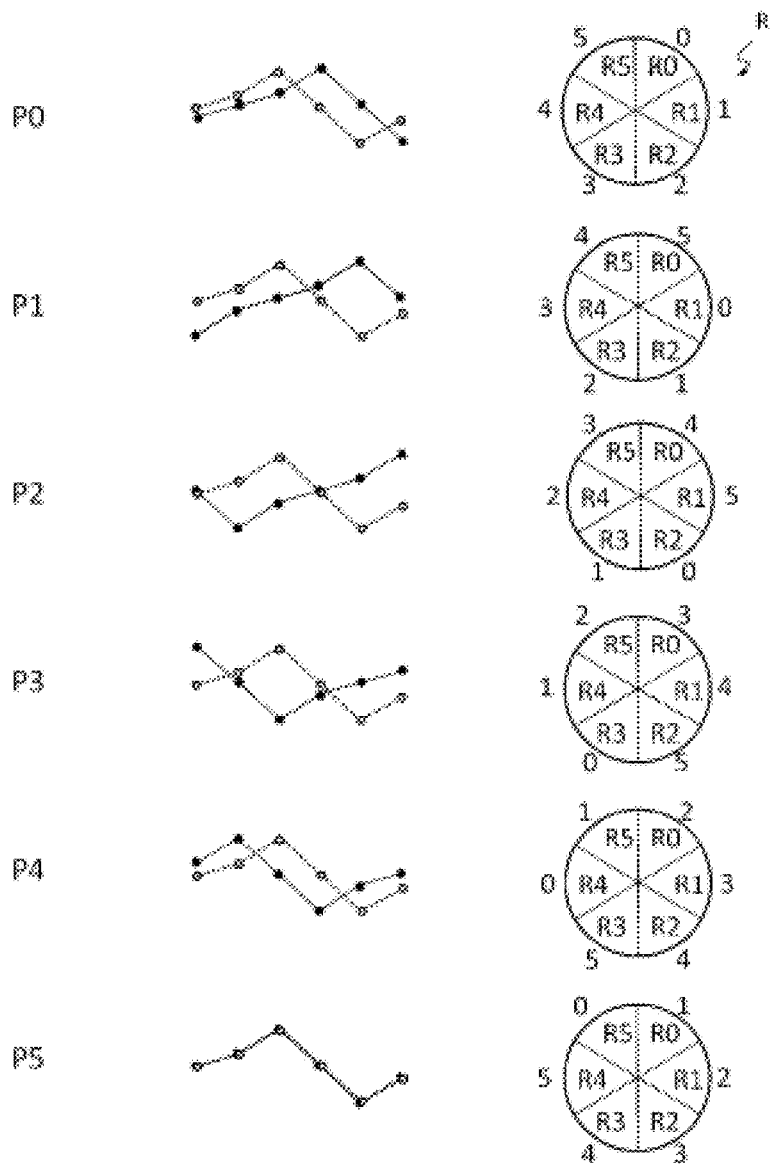
FIG. 4 is a view illustrating a sequence of numerical values when a rotation start position of the rotor at the time of restart is located at each of positions of the six magnetic pole pairs R0, R1, R2, R3, R4, and R5 at the time of acquiring learning data.

FIG. 4 illustrates a sequence of numerical values when a rotation start position of the rotor at the time of restart is located at each of positions of the six magnetic pole pairs R0, R1, R2, R3, R4, and R5 at the time of acquiring the learning data. In the example of FIG. 4, matching of "P0" is performed assuming a case where a magnetic pole pair that has generated a first maximum value indicated by "0" in FIG. 3 is located at the position of the magnetic pole pair R0 during learning. Matching of "P1" is performed assuming a case where the position of the magnetic pole pair "0" is located at the position of the magnetic pole pair R1 during learning. Each matching of "P2", "P3", "P4" and "P5" is performed assuming a case where the position of the magnetic pole pair "0" is located at the position of each of the magnetic pole pairs R2, R3, R4, and R5 during learning.

As can be seen from FIG. 4, an error is smallest in the pattern matching of "P5". In other words, it can be understood that the position of the magnetic pole pair 0 of the rotor after the restart is the position of the magnetic pole pair R5 at the time of acquiring the learning data. Conversely, the position of the magnetic pole pair R0 at the time of acquiring the learning data corresponds to the position of the magnetic pole pair 1 of the rotor after the restart. Since such pattern matching is performed, it is possible to obtain a phase difference with respect to a numerical array in learning data of a numerical array acquired after the restart.

In the embodiment of the present disclosure, such pattern matching can be performed by the following steps, for example.

First, the learning data stored in the storage medium includes a learning pattern R1 shown in Table 1. A sequence of numerical values of this learning pattern R1 matches with the sequence of the numerical values of FIG. 3A.

Using the numerical value "7490" of the magnetic pole pair R0 as a reference value, a relative relationship ("High" or "Low") of a numerical value with respect to the reference value is determined for each of the other magnetic pole pairs R1 to R5. Table 1 shows results of this determination. Specifically, when calculating the numerical value of the magnetic pole pair R1 (7590)–the numerical value of the magnetic pole pair R0 (7490: the reference value), 7590−7490=100 is obtained. Since 100 is a large positive value that exceeds a threshold range, a determination result of "High" is obtained. The threshold range is, for example, "a range of −30 or more and +30 or less". When calculating the numerical value of the magnetic pole pair R2 (7790)–the numerical value of the magnetic pole pair R0 (7490: the reference value), 7790−7490=300 is obtained. Since 300 is a large positive value that exceeds the threshold range, the determination result of "High" is obtained. When calculating the numerical value of the magnetic pole pair R3 (7495)–the numerical value of the magnetic pole pair R0 (7490: the reference value), 7495−7490=5 is obtained. Since 5 falls within the threshold range, a result of "Undeterminable" is obtained. When calculating the numerical value of the magnetic pole pair R4 (7190)–the numerical value of the magnetic pole pair R0 (7490: the reference value), 7190−7490=−300 is obtained. Since −300 is a negative value smaller than the threshold range, a determination result of "Low" is obtained. When calculating the numerical value of the magnetic pole pair R5 (7390)–the numerical value of the magnetic pole pair R0 (7490: the reference value), 7390−7490=−100 is obtained. Since −100 is a negative value smaller than the threshold range, a determination result of "Low" is obtained.

"High", "High", "Undeterminable", "Low", and "Low" described in Table 1 define an increase/decrease pattern of a plurality of measurement values which define a waveform characteristic of an electrical signal. This increase/decrease pattern may be stored in the storage medium as a part of the learning data obtained offline, or may be created from the learning data at the time of pattern matching. A similar increase/decrease pattern can be determined regarding a plurality of detection values which define a waveform characteristic of an electrical signal acquired at the time of starting the motor after reactivation of the power. This increase/decrease pattern is created online. Hereinafter, an example of a method of determining such an increase/decrease pattern will be described.

The following Table 2 describes six candidates P1, P2, P3, P4, P5, and P6 obtained from the plurality of detection values regarding positions of the rotor.

TABLE 1

| Learning data | | R0 | R1 | R2 | R3 | R4 | R5 |
|---|---|---|---|---|---|---|---|
| R1 | Measurement value | 7490 | 7590 | 7790 | 7495 | 7190 | 7390 |
| | Increase/ decrease | | High | High | Undeterminable | Low | Low |

TABLE 2

| Candidate | | R0 | R1 | R2 | R3 | R4 | R5 | Error |
|---|---|---|---|---|---|---|---|---|
| P0 | Detection value | <u>7400</u> | 7500 | 7600 | 7800 | 7505 | 7200 | 1 |
|    | Increase/decrease |  | High | High | — | High No | Low |  |
| P1 | Detection value | 7200 | <u>7400</u> | 7500 | 7600 | 7800 | 7505 | 2 |
|    | Increase/decrease |  | High | High | — | High No | High No |  |
| P2 | Detection value | 7505 | 7200 | <u>7400</u> | 7500 | 7600 | 7800 | 4 |
|    | Increase/decrease |  | Low No | Low No | — | High No | High No |  |
| P3 | Detection value | 7800 | 7505 | 7200 | <u>7400</u> | 7500 | 7600 | 2 |
|    | Increase/decrease |  | Low No | Low No | — | Low | Low |  |
| P4 | Detection value | 7600 | 7800 | 7505 | 7200 | <u>7400</u> | 7500 | 1 |
|    | Increase/decrease |  | High | Low No | — | Low | Low |  |
| P5 | Detection value | 7500 | 7600 | 7800 | 7505 | 7200 | <u>7400</u> | 0 |
|    | Increase/decrease |  | High | High | — | Low | Low |  |

The rotor position candidates P0, P1, P2, P3, P4, and P5 are arrays, respectively, obtained by shifting a phase of a sequence of detection values obtained online by a predetermined mechanical angle (360 degrees/the number of pole pairs). The candidate P0 is a sequence of the plurality of detection values (maximum values in this example) which define the waveform characteristic of the electrical signal acquired at the time of starting the motor after reactivation of the power. Following the maximum value of "7400" appearing first, five maximum values of "7500", "7600", "7800", "7505", and "7200" are arrayed. These six maximum values respectively correspond to the six magnetic pole pairs of the rotor, but phase relationships thereof are unknown. More specifically, it is unknown any magnetic pole pair among the magnetic pole pairs R0, R1, R2, R3, R4, and R5 of the rotor that causes the maximum value "7400" appearing first.

First, it is assumed that the maximum value "7400" appearing first corresponds to the magnetic pole pair R0 in the candidate P0. In Table 1, the maximum value "7400" appearing first is underlined. Using this maximum value "7400" as a reference value, a relative relationship ("High" or "Low") of the maximum values assigned to the other magnetic pole pairs R0, R1, R2, R3, R4, and R5 is determined. As a result, an increase/decrease pattern of "High", "High", "No determination", "High", and "Low" is determined. The number of mismatches (error point) is counted by comparing this increase/decrease pattern with the increase/decrease pattern in the learning data. The number of mismatches in the candidate P0 is one.

Next, the number of mismatches of the increase/decrease pattern in the candidate P1 is counted. Specifically, each of the maximum values is shifted by one magnetic pole pair assuming that the maximum value "7400" appearing first corresponds to the magnetic pole pair R1. In the candidate P1, a relative relationship ("High" or "Low") of the maximum values assigned to the other magnetic pole pairs R0, R1, R2, R3, R4, and R5 is determined using the maximum value "7200" as a reference value. As a result, an increase/decrease pattern of "High", "High", "No determination", "High", and "High" is determined. The number of mismatches (error point) is counted by comparing this increase/decrease pattern with the increase/decrease pattern in the learning data. The number of mismatches in the candidate P1 is two.

Hereinafter, increase/decrease patterns are determined regarding the other candidates P2 to P5 in the same manner, and the number of mismatches with the increase/decrease pattern in the learning data is counted. As a result, it can be understood that the position of the rotor of the candidate P5 in this example illustrates the increase/decrease pattern with the fewest mismatches. Therefore, it is determined that the maximum value "7400" appearing first corresponds to the magnetic pole pair R1.

According to the above method, it is possible to find one magnetic pole pair using the six candidates obtained from the learning data, for the initial position (phase) of the rotor.

In this example, the increase/decrease pattern of the sequence of the plurality of measurement values (detection values) is defined by a relative magnitude with respect to the reference value. More specifically, the increase/decrease pattern of the sequence of the plurality of measurement values is a sequence of signs indicating the relative magnitude with respect to the reference value of each of the plurality of measurement values acquired while the rotor starts rotating from the stopped state and rotates 360 degrees in terms of mechanical angle. Further, the increase/decrease pattern of the sequence of the plurality of detection values is a sequence of signs indicating the relative magnitude with respect to the reference value of each of the plurality of detection values acquired while the rotor starts rotating from the stopped state and rotates 360 degrees in terms of mechanical angle. Examples of the increase/decrease pattern that can be adopted in the present disclosure are not limited thereto.

Further, the reference value defining the relative magnitude of the increase/decrease pattern of the sequence of the plurality of measurement values is any one value in the sequence of the plurality of measurement values in the above example. Similarly, the reference value defining the relative magnitude of the increase/decrease pattern of the sequence of the plurality of detection values is any one value in the sequence of the plurality of detection values. However, each reference value may be a preset value or a value calculated based on a plurality of measurement values and a plurality of detection values.

In the above example, the increase/decrease pattern is determined from the sequence of the maximum values of the electrical signal output from one Hall sensor. The increase/decrease pattern may be determined from a sequence of maximum values of electrical signals output from two or three Hall sensors. Further, the increase/decrease pattern may be determined from a sequence of maximum values and/or minimum values of electrical signals output from one or a plurality of Hall sensors. It is preferable that the number of elements constituting the increase/decrease pattern be increased in order to enhance the precision of pattern matching. However, a calculation time becomes longer as the number of these elements increases. Therefore, the number of elements can be determined in consideration of the precision and calculation time.

In the above example, the sensor device includes a plurality of magnetic field sensor elements. Each of these magnetic field sensor elements detects a magnetic field formed by the magnetic pole of the rotor, and generates an electrical signal having a magnitude in response to an intensity of the detected magnetic field. At this time, the plurality of measurement values and detection values that define the waveform characteristics of the electrical signals can be set to values indicating the magnitudes in response to the intensities of the detected magnetic fields. Further, a value indicating a magnitude in response to time information for each segment to be described below may be used as the plurality of measurement values and detection values that define the waveform characteristics of the electrical signals. Further, both the first electrical signal and the second electrical signal are signals output from one common magnetic field sensor element or the plurality of magnetic field sensor elements included in the sensor device. However, the sensor device according to the present disclosure is not limited to such an example. The sensor device may have a plurality of current sensor elements. In such a case, each of the plurality of current sensor elements detects a current flowing through the plurality of windings of the stator, and generates an electrical signal having a magnitude in response to an intensity of the detected current. Further, each of the first electrical signal and the second electrical signal is a signal output from one common current sensor element or the plurality of current sensor elements included in the sensor device.

Hereinafter, in configuration example of the embodiments, the superscript * represents a command value unless otherwise specified. Further, the hat code ^ represents an estimation value. In the present disclosure, CW rotation is rotation in the clockwise direction as viewed from an output shaft side of the motor. CCW rotation is rotation in the counterclockwise direction as viewed from the output shaft side.

An exemplary basic configuration of a motor module according to the present disclosure will be described with reference to FIG. 5.

Figure 5:
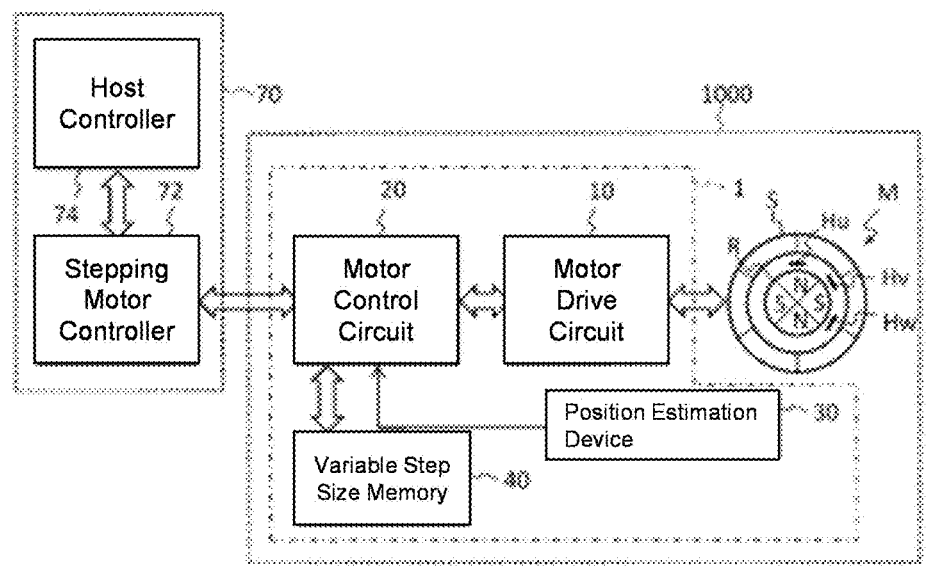
FIG. 5 is a block diagram illustrating an exemplary basic configuration of a motor module according to the present disclosure.

A motor module 1000 illustrated in FIG. 5 includes a motor M and a control system 1 that controls an operation of the motor M. The motor M includes the rotor R and the stator S. A typical example of the motor M in the present disclosure is a brushless DC motor. The control system 1 includes a motor drive circuit 10 that drives the motor M, and a motor control circuit 20 connected to the motor drive circuit 10, and can cause the motor M to execute a step operation. Note that a bidirectional white arrow is illustrated between blocks in FIG. 5. This arrow does not mean that information such as a signal and data can always move in two directions. Between the motor drive circuit 10 and the motor control circuit 20, for example, a signal may be sent from the motor control circuit 20 to the motor drive circuit 10 in one direction.

The motor module 1000 is connected to an external device 70. The external device 70 in this example includes a stepping motor controller 72 and a host controller 74 that controls the stepping motor controller 72. The stepping motor controller 72 outputs a pulse signal to drive a normal stepping motor. The motor control circuit 20 can receive this pulse signal and cause the motor M, which is not the stepping motor, to execute the step operation. The motor drive circuit 10 applies a voltage required for the operation of the motor M based on a voltage command value output from the motor control circuit 20. The motor drive circuit 10 includes, for example, an inverter circuit and a pre-driver. The inverter circuit may be a bridge circuit having a plurality of power transistors. The motor drive circuit 10 typically receives a pulse width modulation (PWM) signal, as the voltage command value, from the motor control circuit 20, and applies a pseudo sine wave voltage to the motor M.

When the motor module 1000 of the present disclosure is used for a multifunction machine, for example, the external device 70 includes various control circuits in addition to the stepping motor controller 72. In general, such control circuits can be implemented by one or a plurality of application-specific integrated circuit chips, together with the stepping motor controller 72. Therefore, when a stepping motor in a conventional multifunction machine is replaced with another motor (for example, a brushless DC motor), it is difficult to change the function of the stepping motor controller 72 so as to be adapted for the operation of the brushless DC motor. With the configuration of the motor module 1000 according to the present disclosure, the stepping motor can be changed to another type of motor M and used without changing a fundamental design of the external device 70 which has been manufactured on the premise of the use of the stepping motor.

The illustrated motor module 1000 further includes a position estimation device 30 that outputs a position estimation signal of the rotor R, and a variable step size memory 40 that stores variable step size information. The position estimation signal is a signal indicating a position estimation value of the rotor R. The position estimation signal is input from the position estimation device 30 to the motor control circuit 20.

The position estimation device 30 in the present embodiment determines a position (initial position) of the rotor at the time of starting the motor by executing the position estimation method described above. After determining the initial position of the rotor, a position of the rotating rotor is estimated and the position estimation signal is output as will be described below. The position estimation signal output by the position estimation device 30 in the present embodiment is not a pulse sequence, but has a magnitude which linearly changes according to the position of the rotor R. In this respect, the position estimation signal according to the present disclosure is significantly different from a rotation position detection signal that is output from any known rotary encoder. An outline of an example of the position estimation signal will be described below with reference to FIG. 7B.

In the embodiment of the motor module according to the present disclosure, the position estimation signal has a magnitude that changes linearly according to a change in position (mechanical angle) of the rotor R. Therefore, the rotor R can be positioned without being limited by the resolution of the rotary encoder. Further, as a result, it is also possible to freely change a "displacement amount (step size) of the rotor" per pulse of the pulse signal that is sent out from the external device 70.

Information which defines the "displacement amount of the rotor" per pulse of the pulse signal that is input from the external device 70, that is, "variable step size information", is stored in the variable step size memory 40. Conventionally, a displacement amount (rotation angle) of a rotor of a stepping motor per pulse of a pulse signal is referred to as a "step angle". For example, when the step angle is 0.9°, the displacement amount of the rotor per pulse of the pulse signal is 0.9°. In the conventional stepping motor, the smallest unit of the step angle is determined by a mechanical structure of the motor. When using a stepping motor whose step angle has a smallest unit of 0.9°, it is difficult to perform positioning of the rotor with an arbitrary angle smaller than 0.9°. According to the embodiment of the present disclosure, however, the displacement amount of the rotor per pulse of the pulse signal can be determined without being constrained by the mechanical structure of the motor.

When receiving the pulse signal from the external device 70, the motor control circuit 20 according to the present disclosure determines the voltage command value based on the position estimation value of the rotor R, which has been acquired from the position estimation device 30, and the variable step size information which has been read from the variable step size memory 40. The motor drive circuit 10 drives the motor M based on this voltage command value to change the position of the rotor R.

Figure 6:
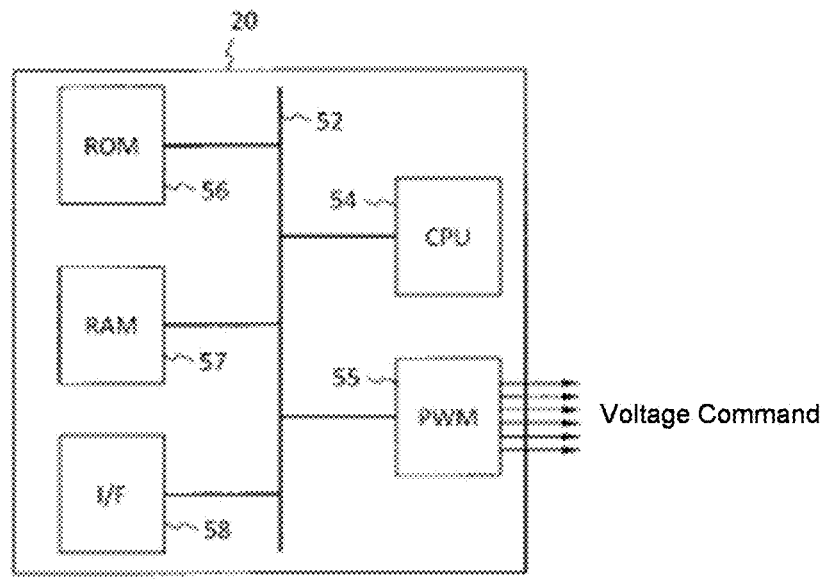
FIG. 6 is a diagram illustrating an example of a hardware configuration of a motor control circuit 20 in the motor module according to the present disclosure.

The motor control circuit 20 may have the hardware configuration illustrated in FIG. 6, for example. The motor control circuit 20 in this example includes a central processing unit (CPU) 54, a PWM circuit 55, a read-only memory (ROM) 56, a random-access memory (RAM) 57, and an input/output interface (I/F) 58 which are connected to each other via a bus. Other circuits or devices (such as an AD converter), which are not illustrated, may be additionally connected to the bus. The PWM circuit 55 applies a PWM signal to the motor drive circuit 10 of FIG. 5. A program and data that define the operation of the CPU 54 are stored in at least one of the ROM 56 and the RAM 57. The above motor control circuit 20 can be implemented by, for example, a general-purpose 32-bit microcontroller. Such a microcontroller may be configured using one or a plurality of integrated circuit chips, for example.

Although the variable step size memory 40 described above is illustrated to be separate from the motor control circuit 20 in FIG. 5, a part of at least one of the ROM 56 and the RAM 57 in the motor control circuit 20 may implement the variable step size memory 40. Further, the motor control circuit 20 may implement some or all of the functions of the position estimation device 30.

Details of various operations performed by the motor control circuit 20 will be described below. Typically, the various operations performed by the motor control circuit 20 are defined by a program. Some or all of the operations of the motor control circuit 20 can be changed by updating a part or a whole of the content of the program. Such update of the program may be performed using a recording medium that stores the program, or may be performed via wired or wireless communication. The communication can be performed using the I/F 58 of FIG. 6. In order to reduce the amount of calculation of the CPU 54 illustrated in FIG. 6, some of the various operations performed by the motor control circuit 20, for example, a part of vector calculation, may be executed by a hardware circuit that is dedicated to such calculation.

Figure 7A:
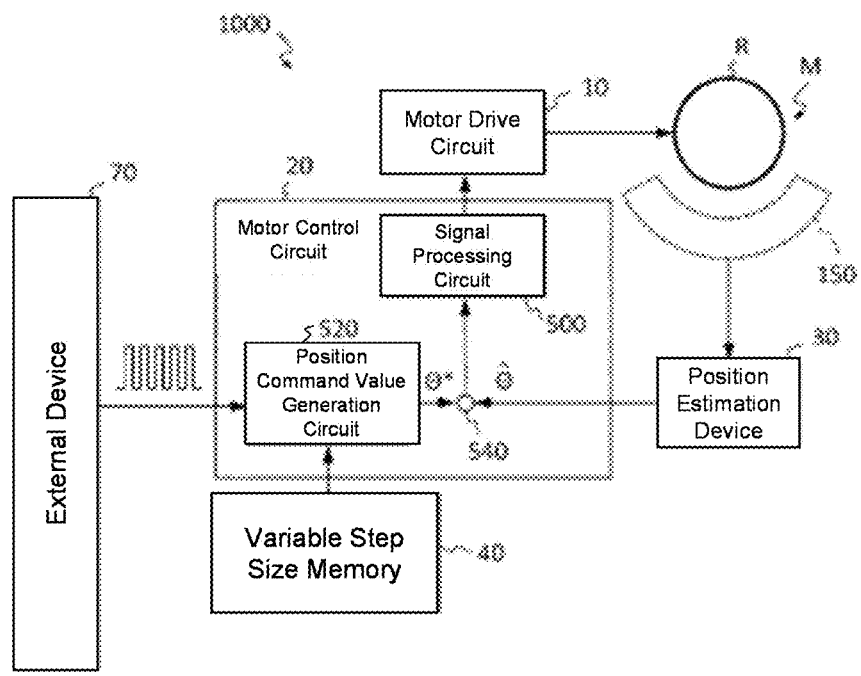
FIG. 7A is a diagram schematically illustrating functional blocks of the motor control circuit 20.

FIG. 7A is a diagram schematically illustrating functional blocks of the motor control circuit 20. The illustrated motor control circuit 20 includes a signal processing circuit 500, a position command value generation circuit 520, and a calculator 540. The position command value generation circuit 520 generates a position command value $\Theta^*$ based on the pulse signal input from the external device 70, and inputs the position command value $\Theta^*$ to the calculator 540.

A position estimation value $\hat{\Theta}$ output from the position estimation device 30 is also input to the calculator 540. The position estimation device 30 estimates a position of the rotor R based on a signal from a detection device 150 that senses the position of the rotor R. For example, when the position command value $\Theta^*$ is 45.5° and the position estimation value $\hat{\Theta}$ is 30°, the calculator 540 and the signal processing circuit 500 calculate a voltage command value to move (rotate) the rotor R from the position of $\Theta=30°$ to the position of $\Theta=45.5°$. This voltage command value is calculated as an appropriate value according to the displacement of the rotor R, and is applied to the motor drive circuit 10 at intervals of about 50 microseconds, for example. The motor control circuit 20 controls the motor drive circuit 10 to drive the motor M until the position estimation value $\hat{\Theta}$ received from the position estimation device 30 becomes equal to the position command value $\Theta^*$. When the motor control circuit 20 outputs the PWM signal as the voltage command value, a cycle of outputting the voltage command value may be referred to as a "PWM cycle".

Figure 7B:
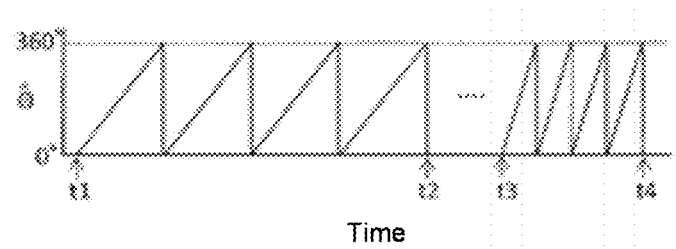
FIG. 7B is a view illustrating an example of a signal indicating a position estimation value $\Theta^\wedge$ of the rotor R output from a position estimation device 30.

FIG. 7B is a view illustrating a waveform example of a signal indicating the position estimation value $\hat{\Theta}$ output from the position estimation device 30. While the mechanical angle of the rotor R increases from $\kappa°$ to 360°, the magnitude of the signal indicating the position estimation value $\hat{\Theta}$ linearly increases from zero to a predetermined value. In other words, while the rotor R makes one turn, the magnitude of the signal indicating the position estimation value $\hat{\Theta}$ changes continuously and linearly. When the rotor R rotates by two or more turns, the magnitude of the signal indicating the position estimation value $\hat{\Theta}$ undergoes cyclic changes. This cycle coincides with the time for which the rotor R makes one turn. Further, the signal indicating the position estimation value $\hat{\Theta}$ has a magnitude that differs according to the position of the mechanical angle of the rotor R. The mechanical angle (position) of the rotor R can be uniquely specified from the magnitude of the signal indicating the position estimation value $\hat{\Theta}$.

In the example of FIG. 7B, the rotor R makes four turns at a constant rotation speed during a period from time t1 to time t2. Further, the rotor R makes four turns at a constant rotation speed during a period from time t3 to time t4. The rotational speed in the period from time t3 to time t4 is higher than the rotational speed in the period from time t1 to time t2.

Figure 8:
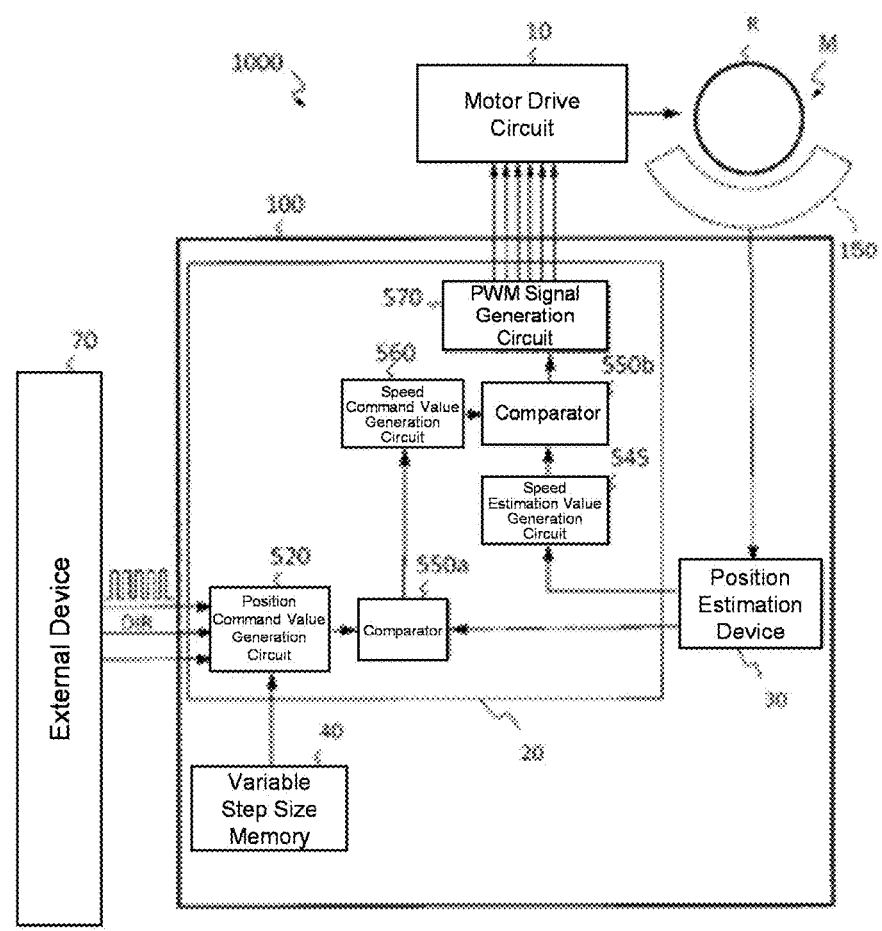
FIG. 8 is a diagram illustrating a detailed configuration example of functional blocks of the motor control circuit 20 according to the present disclosure.

Next, the motor control circuit 20 will be described in more detail with reference to FIG. 8. FIG. 8 is a diagram illustrating a configuration example of functional blocks of the motor control circuit 20 according to the present disclosure. In this example, the motor control circuit 20, the position estimation device 30, and the variable step size memory 40 are implemented by a microcontroller. In the present application, there is a case where such a microcontroller is referred to as a "motor control device" and is indicated by reference sign "100".

The motor control circuit 20 illustrated in FIG. 8 includes the position command value generation circuit 520, a speed estimation value generation circuit 545, comparators 550a and 550b, and a speed command value generation circuit 560. In FIG. 8, the term "circuit" of each component is omitted for simplicity.

The position command value generation circuit 520 receives the pulse signal and generates the position command value $\Theta^*$. The position command value generation circuit 520 may store the content of the variable step size memory 40 as a table. The position command value generation circuit 520 includes a plurality of terminals that receive a signal (external signal) output from the external device 70 in FIG. 5.

The position command value generation circuit 520 according to a certain embodiment generates the position command value Θ* based on the following formula.

$$\Theta^* = \Theta_{set} \times N\_STMP \times Dir + \hat{\Theta} \quad \text{(Formula 1)}$$

Here, $\hat{\Theta}$ is the position estimation value, Θset is the step size, N_STMP is a pulse count number of a pulse signal input from the external device 70 within a set period, and Dir is a sign that defines a rotation direction (displacement direction) of the rotor. When the displacement direction is a first direction, Dir=1. When the displacement direction is a second direction opposite to the first direction, Dir=−1.

An example in which a value of 0.45° is selected as the step size Θset will be described. In this example, it is assumed that the pulse count number N_STMP is 50 in a current period for T milliseconds from time t0 to t1 of the pulse signal input to a STMP terminal, and a signal applied to a DIR terminal in the current period indicates Dir=1. Further, it is also assumed that the current position estimation value $\hat{\Theta}$ of the rotor R acquired from the position estimation device 30 is 112.4°. In this case, according to the above Formula 1, the position command value Θ* has the following value.

$$0.45° \times 50 \times 1 + 112.4° = 134.9°$$

In this example, the position command value generation circuit 520 outputs a digital signal indicating the position command value of 134.9°.

The position command value output from the position command value generation circuit 520 is applied to the comparator 550a. The comparator 550a compares the position estimation value acquired from the position estimation device 30 with the position command value acquired from the position command value generation circuit 520 and outputs a deviation between the position estimation value and the position command value. The speed command value generation circuit 560 generates a speed command value based on the value of the comparator 550a. The speed command value output from the speed command value generation circuit 560 is applied to the comparator 550b. The comparator 550b compares the speed estimation value acquired from the speed estimation value generation circuit 545 with the speed command value, and outputs a deviation.

The motor control circuit 20 determines a voltage command value using these comparison results, and outputs the PWM signal indicating the voltage command value from the PWM signal generation circuit 570. The determination on the voltage command value can be executed, for example, by calculation using any known vector control technique.

Note that current control is omitted in FIG. 8, but the current control may be performed after the speed control. Further, the present invention is not limited to the combination of the position control and the speed control. Here, the motor control circuit 20 may generate the position command value and the speed command value based on the variable step size information and the pulse signal.

Figure 9:
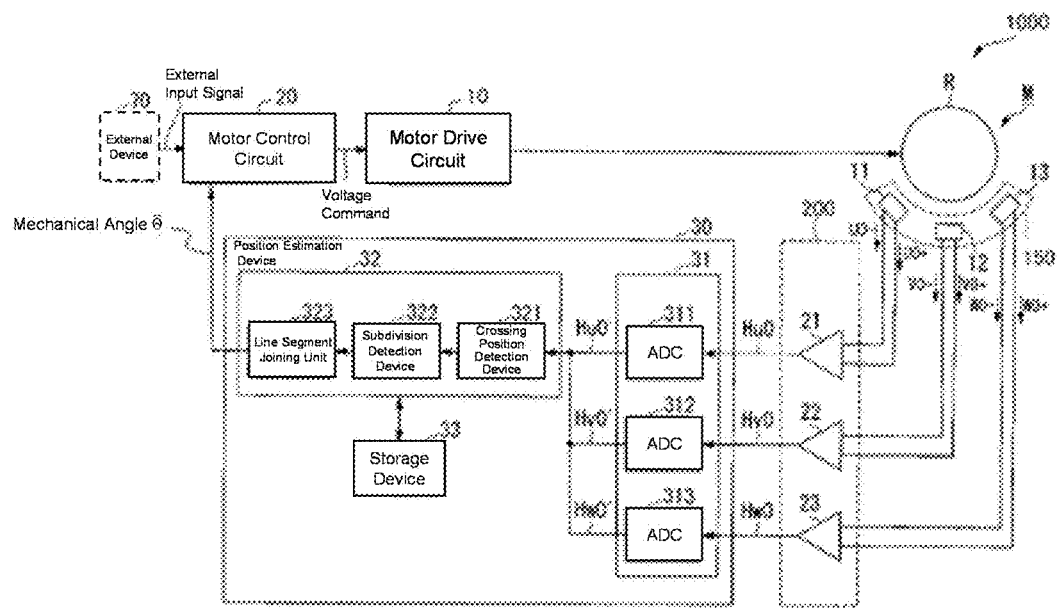
FIG. 9 is a schematic diagram illustrating an example of a configuration of a motor module 1000 according to an embodiment of the present disclosure.

FIG. 9 is a schematic diagram illustrating a configuration example of the motor module 1000 according to the embodiment of the present disclosure.

As illustrated in FIG. 9, the motor module 1000 according to the present embodiment includes: the motor M, the detection device 150, an amplifier circuit 200, the position estimation device 30, the motor control device (control circuit) 20, and the motor drive circuit (drive circuit) 10. The motor M in the present embodiment is a brushless DC motor, and has the rotor R that rotates about the center axis.

An external signal such as a pulse signal that specifies a rotation position of the rotor R is input to the motor module 1000 from the external device (controller) 70. The motor module 1000 is used by being attached to a product. For example, the product may be a multifunction machine having functions of a printer, a scanner, a facsimile, and the like, or an electric machine such as electric power steering, an antenna tilter, and a fan. When used in the multifunction machine, the motor M of the motor module 1000 is used by being attached to a mechanism (mechanical part), for example, a sheet-feeding functional unit. One multifunction machine may include a plurality of the motor modules 1000.

The motor M includes the rotor R. The motor M is, for example, a permanent magnet motor. A board (not illustrated) is attached to the motor M. The detection device 150, the amplifier circuit 200, the position estimation device 30, the motor control circuit 20, and the motor drive circuit 10 are mounted on the board.

Note that the case where the motor M includes the rotor R is described as an example, but the configuration of the present embodiment is not limited thereto. The motor M may be a linear motor. When the motor M is the linear motor, the motor M includes a mover (or movable element) that moves linearly, instead of the rotor R. In the present application, the term "mover" encompasses not only the rotor, but also parts that move linearly in the linear motor. In the case of the linear motor, CW means a first direction on a straight line, and CCW means a second direction opposite to the first direction on the same straight line.

The detection device 150 includes sensors 11 to 13. Each of the sensors 11 to 13 is a non-contact magnetic sensor which converts a magnetic field generated in the motor M into an electrical signal and outputs the electrical signal. Each of the sensors 11 to 13 is a Hall element, for example. The detection device 150 outputs a detected differential sensor signal to the amplifier circuit 200. The operation of the motor module 1000 in the present embodiment has a signal detection step. In the signal detection step, each of N (N is an integer of three or more) detection devices detects a magnetic field according to a position of the rotor, and outputs a detection signal as the electrical signal. The respective detection signals are shifted in phase by an angle obtained by dividing 360 degrees by N. When the number of such sensors is N (where N is an integer of three or more), magnetic fields that are formed by a plurality of magnetic poles are detected, and detection signals each having a magnitude in response to an intensity of a detected magnetic field are output. The N sensors are arranged such that phases of the N detection signals are shifted by an angle of 360 degrees/N. The state where the phases of the detection signals are shifted by an angle of 360 degrees/N encompasses a state where the phases are shifted by an electrical angle of 360 degrees×an integer±360 degrees/N. A state where the phases of the detection signals are shifted by 120 degrees (=360 degrees/3), for example, encompasses a state where phases of three detection signals are shifted by an electrical angle of 240 degrees (=360 degrees−120 degrees).

The amplifier circuit 200 includes differential amplifiers 21 to 23. The amplifier circuit 200 generates a detection signal Hu0, a detection signal Hv0, and a detection signal Hw0 based on the differential sensor signal input from the detection device 150. The amplifier circuit 200 outputs the generated detection signal Hu0, detection signal Hv0, and detection signal Hw0 to the position estimation device 30.

Note that each of the detection signal Hu0, the detection signal Hv0, and the detection signal Hw0 is an analog signal.

The position estimation device 30 estimates a rotation position of the rotor R based on the detection signal Hu0, the detection signal Hv0, and the detection signal Hw0 input from the amplifier circuit 200. The position estimation device 30 generates a position estimation value θˆ based on the estimated rotation position (mechanical angle) and applies the generated position estimation value Θˆ to the motor control circuit 20.

The position estimation value Θˆ from the position estimation device 30 and the pulse signal from the external device 70 are input to the motor control circuit 20. As described above, the motor control circuit 20 generates a voltage command to drive the motor M, and outputs the generated voltage command to the motor drive circuit 10.

The motor drive circuit 10 generates a drive signal based on the voltage command input from the motor control circuit 20, and drives the motor M according to the generated drive signal. One of typical examples of the motor drive circuit 10 is an inverter circuit. The inverter circuit can include: a PWM circuit that receives a voltage command and outputs a pulse width modulation (PWM) signal; a pre-driver circuit that outputs a gate drive signal based on the PWM signal; and an inverter output circuit that receives the gate drive signal and performs switching.

The motor control circuit 20 and a part of the motor drive circuit 10 (for example, the PWM circuit) may be implemented by one integrated circuit package. Such an integrated circuit package is available as a general-purpose motor control microcomputer. Further, the inverter output circuit of the drive circuit 10 may be referred to as a power module. Such an inverter output circuit can drive the motor M by applying a voltage having a magnitude in response to the voltage command to each coil of the motor M.

As described above, the motor module 1000 receives the pulse signal from the external device 70 and generates the position command value Θ*. Then, the motor is controlled by feeding back the deviation between the position command value Θ* and the position estimation value Θˆ.

In the present embodiment, the position estimation signal indicating the position estimation value Θˆ has the magnitude that linearly changes according to the position (angle) of the rotor R. More specifically, the magnitude of the position estimation signal changes in a continuous straight line, rather than discretely when the rotor R makes one turn. An example of generating such a position estimation signal will be described in detail hereinafter.

Figure 13:
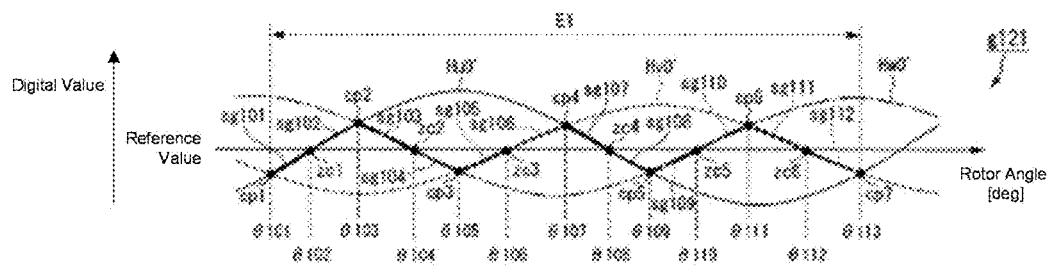
FIG. 13 is a view illustrating relative magnitudes, crossings, zero-crossing points, and subdivision signals among the three detection signals Hu0', Hv0', and Hw0' according to the embodiment.

The motor module 1000 according to the present embodiment sequentially detects crossings at which the detection signals Hu0, Hv0, and Hw0 cross each other, and detects, as a subdivision signal, a portion (subdivided line segment) of the detection signal Hu0, Hv0, or Hw0 from a detected crossing to another crossing which is adjacent to the crossing (see FIG. 13).

Among the three detection signals Hu0, Hv0, and Hw0, which are shifted in phase by 120 degrees, any portion that connects or links a crossing to another crossing which is adjacent to the crossing is a portion of any one signal Hu0, Hv0, or Hw0 that has an intermediate level among the detection signals Hu0, Hv0, and Hw0. As illustrated in FIG. 13, a portion that connects a crossing to another crossing which is adjacent to the crossing crosses a level of the reference value. In other words, a portion that connects a crossing to another crossing which is adjacent to the crossing has a portion larger than the reference value and a portion smaller than the reference value. As will be described below, a portion that connects a crossing to another crossing which is adjacent to the crossing can be processed as a single "subdivision signal", or processed as two "subdivision signals". In the latter case, a portion that connects a crossing to another crossing which is adjacent to the crossing is divided into two portions by a point of zero-crossing that crosses the reference value. A portion that connects a crossing to another crossing which is adjacent to the crossing may be divided into three or more "subdivision signals".

Figure 14:
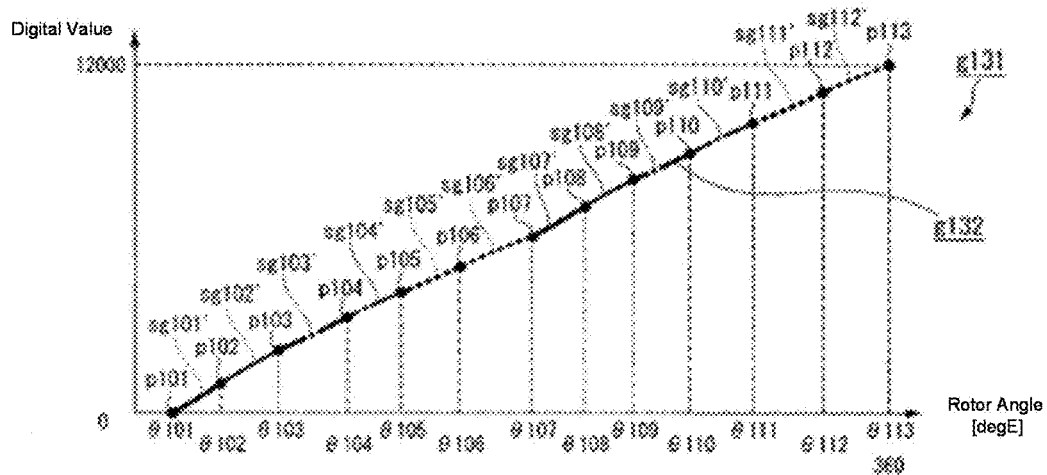
FIG. 14 is a view illustrating joining of subdivision signals for one cycle of electrical angle according to the embodiment.
Figure 15:
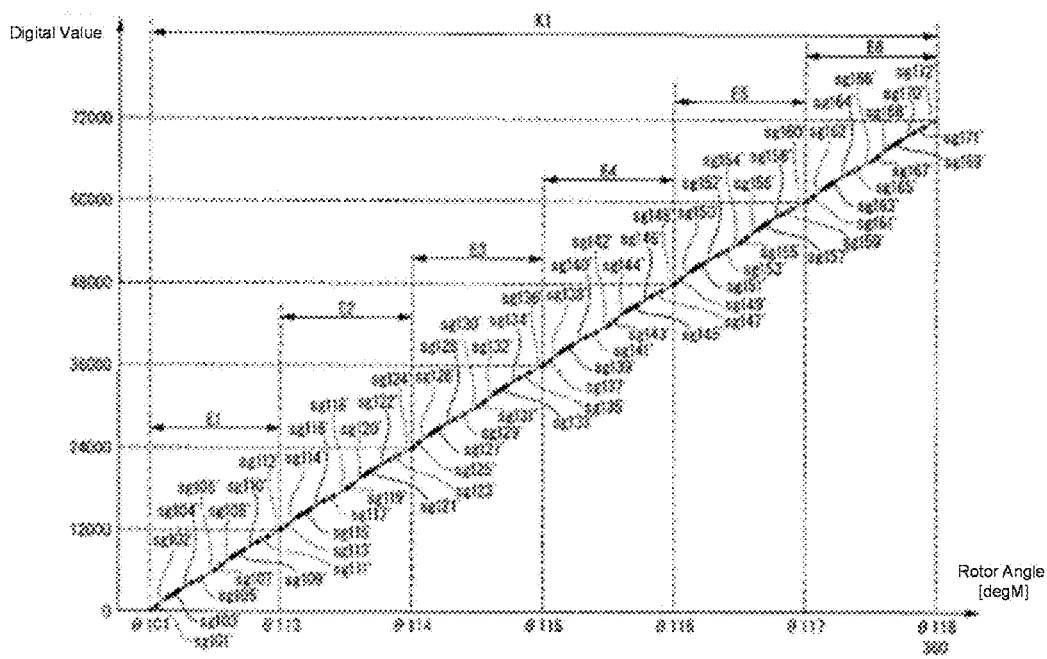
FIG. 15 is a view illustrating a specific example of joining for one cycle of mechanical angle of subdivision signals of an operation by a line segment joining unit 323.

The motor module 1000 sequentially joins the detected subdivision signals according to a moving direction of the rotor, and estimates a position of the rotor based on the plurality of joined subdivision signals to generate a position estimation signal (see FIGS. 14 and 15). Note that the position estimation value can be used as a feedback value for a current control system, a speed control system, a position control system, or a control system which is a combination thereof.

Next, a schematic configuration of the motor M according to the present embodiment will be described.

Figure 10:
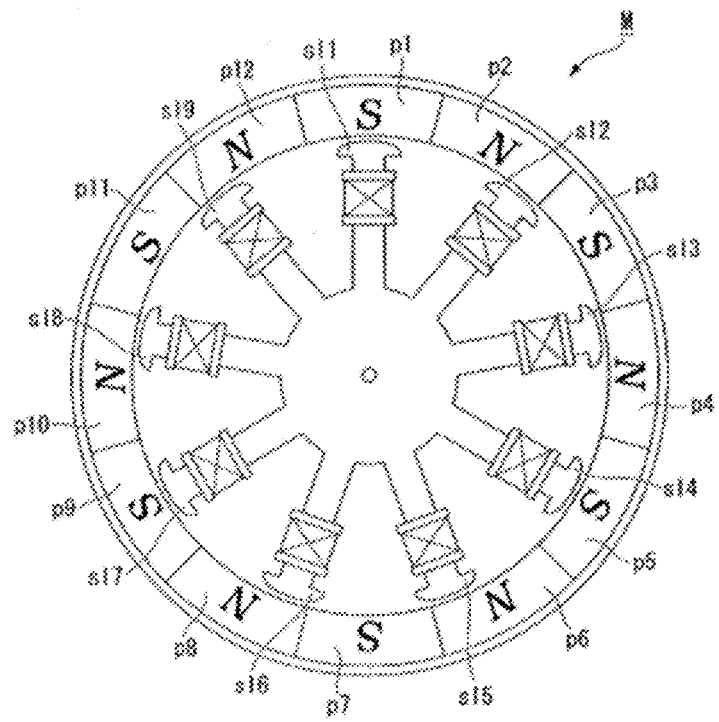
FIG. 10 is a schematic configuration view of a motor M according to the embodiment.

FIG. 10 is a schematic configuration view of the motor M according to the present embodiment. In the example illustrated in FIG. 10, the motor M is a permanent magnet motor. Magnetic poles p1 to p12 are magnetic poles (poles) of the permanent magnet motor. The number of poles represents the number of magnetic poles in the motor M, and is 12 in the example illustrated in FIG. 10. Further, the number of pole pairs indicates the number of pairs of an N pole and an S pole, and is six in the example illustrated in FIG. 10. Further, slots s11 to s19 are armatures (stators) around which coils are wound. The number of slots in the permanent magnet motor according to the present embodiment is nine. The magnetic poles p1 to p12 are each part of the rotor R (see FIG. 9). The motor M in FIG. 10 is a motor of an outer rotor type.

Next, operations of the sensors 11 to 13 will be described.

Each of the sensors 11 to 13 detects a magnetic field formed by a pair of adjacent N pole and S pole, and outputs a signal for one cycle. This corresponds to one cycle of electrical angle. Each of the sensors 11 to 13 outputs the detected electrical signal for one cycle of electrical angle to the amplifier circuit 200 as a differential sensor signal. This differential sensor signal for one cycle corresponds to one cycle of electrical angle.

Here, the respective sensors 11 to 13 detect electrical signals whose phases are shifted by 120 degrees of electrical angle, and output the detected electrical signals to the corresponding differential amplifiers 21 to 23. That is, the detection device 150 includes the three sensors, and the phases of the three detection signals are shifted by 120 degrees. In a specific example, the sensors 11 to 13 detect electrical signals whose phases are shifted by 40 degrees of mechanical angle (240 degrees of electrical angle).

In the present embodiment, the electrical signal detected by the sensor 11 is defined as the U phase. The electrical signal detected by the sensor 12 is defined as the V phase. The electrical signal detected by the sensor 13 is defined as the W phase. The differential sensor signals output by the sensor 11 are differential sensor signals U0+ and U0−, which are in an inverse relationship with each other. The differential sensor signals output by the sensor 12 are differential sensor signals V0+ and V0−, which are in an inverse relationship with each other. The differential sensor signals output by the sensor 13 are detection signals W0+ and W0−, which are in an inverse relationship with each other.

Next, the detection signal output from the amplifier circuit 200 will be described with reference to FIG. 9.

The differential amplifier 21 amplifies a voltage difference between the U-phase detection signals U0− and U0+ input from the sensor 11, and outputs an amplified detection signal Hu0 to the position estimation device 30.

The differential amplifier 22 amplifies a voltage difference between the V-phase detection signals V0− and V0+ input from the sensor 12, and outputs an amplified detection signal Hv0 to the position estimation device 30.

The differential amplifier 23 amplifies a voltage difference between the W-phase detection signals W0− and W0+ input from the sensor 13, and outputs an amplified detection signal Hw0 to the position estimation device 30.

Figure 11:
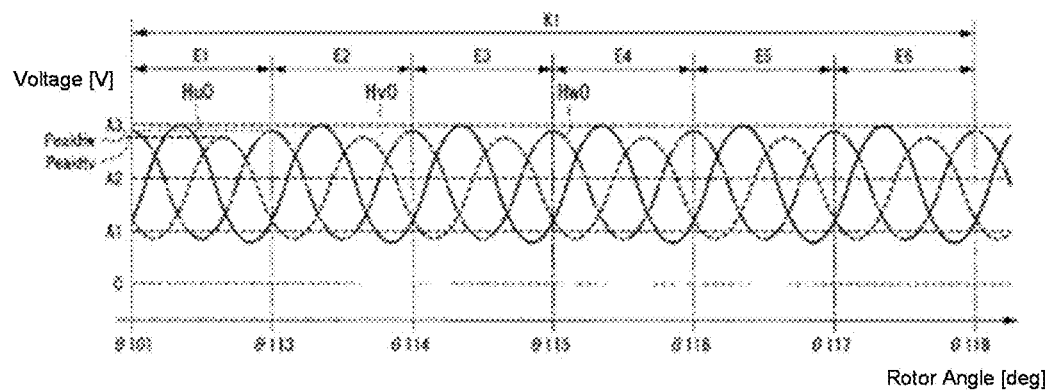
FIG. 11 is a view illustrating examples of detection signals Hu0, Hv0, and Hw0 output by an amplifier circuit 200 according to the embodiment.

Next, examples of the detection signals Hu0, Hv0, and Hw0 output by the amplifier circuit 200 will be described. FIG. 11 is a view illustrating examples of the detection signals Hu0, Hv0, and Hw0 output by the amplifier circuit 200 according to the present embodiment. In FIG. 11, the horizontal axis represents a rotor angle [deg]. The vertical axis represents a magnitude of a signal.

In the example illustrated in FIG. 11, a period E1 from a rotor angle θ101 to a rotor angle θ113 represents one cycle of electrical angle. Each of a period E2 from the rotor angle θ113 to a rotor angle θ114, a period E3 from the rotor angle θ114 to a rotor angle θ115, a period E4 from the rotor angle θ115 to a rotor angle θ116, a period E5 from the rotor angle θ116 to a rotor angle θ117, and a period E6 from the rotor angle θ117 to a rotor angle θ118 represents one cycle of electrical angle. Further, a period K1 from the period E1 to the period E6 represents one cycle of mechanical angle. That is, a period which is equivalent to one cycle of electrical angle is a period obtained by dividing a period which is equivalent to one cycle of mechanical angle by the number of pole pairs.

Further, a maximum value of the detection signal Hu0 is A3 [V] in the example illustrated in FIG. 11. A maximum value of the detection signal Hw0 is PeakHw [V] which is smaller than the voltage value of A3. A maximum value of the detection signal Hv0 is PeakHv [V] which is smaller than the voltage value of PeakHw. In this manner, the detection signals Hu0, Hv0, and Hw0 have amplitude variations due to mounting errors of the sensors 11 to 13 or a difference in sensitivity among the sensors. Further, the signals Hu0, Hv0, and Hw0 respectively have different signal center voltage values. That is, each of the signals Hu0, Hv0, Hw0 has an offset component.

Next, a detailed configuration of the position estimation device 30 will be described with reference to FIG. 9.

The position estimation device 30 includes an AD converter 31, a position calculation unit 32, and a storage device 33. The AD converter 31 converts the detection signal input as the analog signal from the amplifier circuit 200 into a detection signal as a digital signal, and outputs the detection signal of the converted digital signal to the position calculation unit 32. More specifically, the AD converter 31 includes an AD conversion circuit (ADC) 311, an AD conversion circuit (ADC) 312, and an AD conversion circuit (ADC) 313. The AD conversion circuit 311 converts the detection signal Hu0 as the analog signal into a detection signal Hu0' as a digital signal and outputs the detection signal Hu0' to the position calculation unit 32. The AD conversion circuit 312 converts the detection signal Hv0 as the analog signal into a detection signal Hv0' as a digital signal and outputs the detection signal Hv0' to the position calculation unit 32. The AD conversion circuit 313 converts the detection signal Hw0 as the analog signal into a detection signal Hw0' as a digital signal and outputs the detection signal Hw0' to the position calculation unit 32. The storage device 33 stores information to be used in online processing. The online processing is processing to be performed in real time while the rotor R is rotating. Note that the information stored in the storage device 33 will be described below.

The conversion of the detection signal into the signal which is suitable for processing in the position calculation unit 32 as described above can be referred to as "preprocessing". The AD converter 31 is an example of a circuit that performs the preprocessing. A circuit for performing other preprocessing may be provided in the position calculation unit 32.

Figure 12:
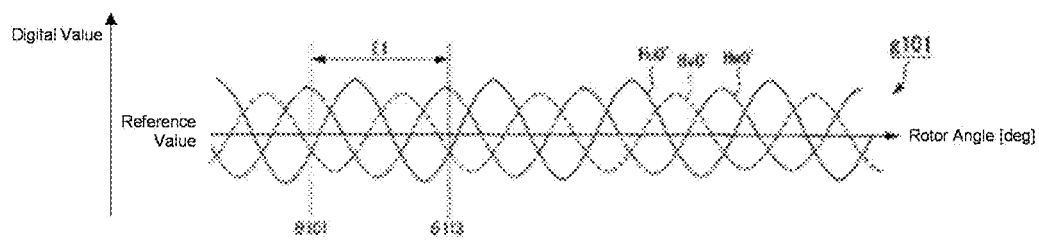
FIG. 12 is a view illustrating examples of detection signals Hu0', Hv0', and Hw0' output by an AD converter 31 according to the embodiment.

In FIG. 12 illustrating the detection signals Hu0', Hv0', and Hw0', which are the digital signals after being converted by the AD converter 31, the horizontal axis represents a rotor angle [deg]. The vertical axis represents a magnitude of a digital value. The position calculation unit 32 includes a crossing position detection device 321, a subdivision detection device 322, and a line segment joining unit 323. The crossing position detection device 321 detects crossings among the detection signals and zero-crossing points among the detection signals and the reference values. That is, between a crossing and another crossing adjacent to the crossing, the crossing position detection device 321 sequentially detects each zero-crossing point at which a potential of a detection signal crosses a reference voltage from the crossing. The reference value is a value whose digital value indicates zero. The crossing position detection device 321 outputs information representing coordinates of the detected crossings and information representing coordinates of the zero-crossing points to the subdivision detection device 322. Here, the information representing the coordinates of the crossings and the zero-crossing points is information expressed by the rotor angle and the magnitude of the digital value. The subdivision detection device 322 detects a detection signal between a crossing and a zero-crossing point as a subdivision signal using the information representing the coordinates of the crossing and the information representing the coordinates of the zero-crossing point which are input from the crossing position detection device 321. The subdivision detection device 322 outputs information representing the detected subdivision signal to the line segment joining unit 323. The line segment joining unit 323 sequentially joints the subdivision signals using the information representing the subdivision signals input from the subdivision detection device 322. Here, the information representing the subdivision signal is information represented by the rotor angle and the magnitude of the digital value from a start position to an end position of the subdivision signal which is a part of the detection signal.

As described above, the operation of the motor module 1000 according to the present embodiment includes a crossing position detection step, a subdivision detection step, and a line segment joining step. In the crossing position detection step, the crossing position detection device 321 sequentially detects the crossings at which the respective detection signals output by the signal detection step cross each other. In the subdivision detection step, the subdivision detection device 322 detects a portion of the detection signal that connects a crossing to another crossing which is adjacent to the crossing as one or a plurality of subdivision signals. In the line segment joining step, the line segment joining unit 323 sequentially joins the subdivision signals and estimates the position of the rotor based on the plurality of joined subdivision signals to generate the position estimation signal.

Next, an overview of a flow of processes performed by the position estimation device 30 will be described, and then, the flow of the processes performed by the position estimation device 30 will be described in detail. The position estimation device 30 performs the following processes through online processing. (Step S101) The crossing position detection device 321 acquires the detection signals Hu0', Hv0', and Hw0' input from the AD converter 31. (Step S102) The crossing position detection device 321 uses values indicated by the detection signals Hu0', Hv0', and Hw0' obtained in Step S101, respectively, to sequentially detect crossings and zero-crossing points. Next, the crossing position detection device 321 sequentially outputs the information representing the coordinates of the detected crossings and zero-crossing points and the input detection signals Hu0', Hv0', and Hw0' to the subdivision detection device 322. (Step S103) The subdivision detection device 322 detects a part of a detection signal from a crossing to a zero-crossing point which is adjacent to the crossing, that is, a partial detection signal from a crossing to a zero-crossing point which is adjacent to the crossing out of the detection signal, as a first subdivision signal. Alternatively, the subdivision detection device 322 detects a part of a detection signal from a zero-crossing point to a crossing which is adjacent to the zero-crossing point, that is, a partial detection signal from a zero-crossing point to a crossing which is adjacent to the zero-crossing point out of the detection signal, as a second subdivision signal. (Step S104) When the rotor R performs the CW rotation, the line segment joining unit 323 sequentially joins the subdivision signals input from the subdivision detection device 322 in the forward direction for one cycle of mechanical angle. (Step S105) The position estimation device 30 estimates a mechanical position based on the subdivision signals joined by the line segment joining unit 323 to determine the position estimation value $\hat{\Theta}$.

The position estimation device 30 repeats the processes of Steps S101 to S105 every control cycle. The control cycle is, for example, any one cycle of the respective control cycles of current (torque), speed, or position control.

Next, the flow of the processes performed by the position estimation device 30 will be described in detail.

When the rotor R is rotating, the crossing position detection device 321 acquires detection signals Hu0', Hv0', and Hw0' which are input from the AD conversion circuits 311, 312, and 313, respectively. The detection signal Hu0', the detection signal Hv0', and the detection signal Hw0' output from the AD converter 31 will be described with reference to FIG. 12.

FIG. 12 is a view illustrating examples of the detection signals Hu0', Hv0', and Hw0' output by the AD converter 31 according to the present embodiment. In FIG. 12, the horizontal axis represents the rotor angle [deg]. The vertical axis represents the digital value. The respective waveforms Hu0', Hv0', and Hw0' illustrated in FIG. 12 are waveform diagrams representing the detection signals having been converted into the digital signals by the AD conversion circuits 311 to 313. For example, when the number of bits of the AD converter 31 is 12 bits, the range of digital signal values is +2047 to −2048. Further, in FIG. 5, the period E1 from the rotor angle $\theta101$ to the rotor angle $\theta113$ corresponds to one cycle of electrical angle.

Next, the process of detecting the crossing and zero-crossing point performed in Step S102 by the crossing position detection device 321 will be described in detail.

The crossing position detection device 321 acquires the detection signals Hu0', Hv0', and Hw0' output from the AD converter 31. The crossing position detection device 321 sequentially calculates and detects crossings among the acquired detection signals from coordinates of two sampled points. Further, the crossing position detection device 321 sequentially detects a zero-crossing point between the acquired detection signal and the reference value. The coordinates of the crossing and zero-crossing point can be indicated by the rotor angle on the horizontal axis and the digital value on the vertical axis. The crossing position detection device 321 detects the coordinates of the crossings, and outputs information representing the detected coordinates of the crossings to the subdivision detection device 322. Further, the crossing position detection device 321 detects the coordinates of the zero-crossing points and outputs information representing the detected coordinates of the zero-crossing points to the subdivision detection device 322. Further, the crossing position detection device 321 outputs the acquired detection signals Hu0', Hv0', and Hw0' to the subdivision detection device 322.

Next, the process of detecting the subdivision signal performed in Step S103 by the subdivision detection device 322 will be described in detail.

The subdivision detection device 322 sequentially acquires the information representing the coordinates of the crossings, the information representing the coordinates of the zero-crossing points, and the detection signals Hu0', Hv0', and Hw0' which have been input from the crossing position detection device 321. Among the acquired detection signals, the subdivision detection device 322 detects a detection signal from a crossing to a zero-crossing point which is adjacent to the crossing as the first subdivision signal. Among the acquired detection signals, the subdivision detection device 322 detects a detection signal from a zero-crossing point to a crossing which is adjacent to the zero-crossing point as the second subdivision signal. The subdivision detection device 322 sequentially outputs the detected subdivision signals to the line segment joining unit 323. Here, the subdivision detection device 322 detects information on a deviation in digital value and a deviation in rotor angle from a crossing to a zero-crossing point which is adjacent to the crossing, as information representing the first subdivision signal.

Next, specific examples of the crossing, the zero-crossing point, and the subdivision signal will be described in order.

First, specific examples of the crossing and the zero-crossing point detected by the crossing position detection device 321 will be described with reference to FIG. 13.

FIG. 13 is a view illustrating relative magnitudes, crossings, zero-crossing points, and subdivision signals among the three detection signals Hu0', Hv0', and Hw0' according to the present embodiment. In FIG. 13, the horizontal axis represents a rotor angle [deg]. The vertical axis represents the digital value. Further, FIG. 13 is an enlarged view of the period E1 from the rotor angle $\theta101$ to the rotor angle $\theta113$ in FIG. 12.

In FIG. 13, points cp1 to cp7 each represent crossings. Here, the crossing is a point where two detection signals cross each other. For example, the crossing cp1 at the rotor angle $\theta101$ is a point at which the detection signal Hu0' and the detection signal Hv0' cross each other.

Further, points zc1 to zc6 each represent zero-crossing points. Here, the zero-crossing point is a point at which any of the detection signals Hu0', Hv0', and Hw0' crosses a reference value of a digital value. For example, the zero-crossing point zc1 at the rotor angle $\theta102$ is a point at which the detection signal Hu0' and the reference value cross each other.

Next, a specific example of the subdivision signal detected by the subdivision detection device 322 will be described with reference to FIG. 13. In the following description, a segment refers to each single subdivision signal. A period of the segment corresponds to a start point to an end point of each subdivision signal. There are 12 periods of the segments in one cycle of electrical angle. When the number of pole pairs of the motor M is six, six cycles of electrical angle corresponds to one cycle of mechanical angle. Therefore, there are 72 periods of segments in one cycle of mechanical angle. A number, from 1 to 12, of each subdivision signal over one cycle of electrical angle may be referred to as a section. The subdivision signal is a detection signal from a crossing cp(n) to a zero-crossing point zc(m) adjacent to the crossing cp(n) in FIG. 13. Alternatively, the subdivision signal is a detection signal from the zero-crossing point zc(m) to a crossing cp(n+1) adjacent to the zero-crossing point zc(m). Note that n is an integer from one to seven. Further, m is an integer from one to six. Specifically, for example, a part of the detection signal Hu0' from the crossing cp1 to the zero-crossing point zc1 is a subdivision signal sg101. Further, a part of the detection signal Hu0' from the zero-crossing point zc1 to the crossing cp2 is a subdivision signal sg102. In FIG. 13, a period from θ101 to θ102, that is, a period of the subdivision signal sg101 corresponds to the period of segment number 1. Further, the respective periods of the subdivision signals sg102 to sg112 correspond to periods of segment numbers 2 to 12.

Note that the detection signals Hu0', Hv0', and Hw0' are sine waves in the example illustrated in FIG. 13, and thus, the subdivision signals sg101 to sg112 are signals in ranges closer to a straight line than the other parts of the sine wave.

Here, the relative magnitudes of the three detection signals Hu0', Hv0', and Hw0' will be described with reference to FIG. 13.

For example, in the period from the rotor angles θ101 to θ103, which corresponds to periods of Segment 1 and Segment 2, the digital value of the detection signal Hw0' is the largest among the three detection signals. The detection signal Hu0' has the second largest digital value following the detection signal Hw0'. The detection signal Hv0' has the smallest digital value. Further, in the period from the rotor angles θ101 to θ102, which is the period of Segment 1, the digital value of the detection signal Hu0' is smaller than the reference value. The digital value of the detection signal Hu0' is larger than the reference value in the period from the rotor angles θ102 to θ103 which is the period of Segment 2.

Even for Segments 3 to 12, combinations of relative magnitudes of the three detection signals Hu0', Hv0', and Hw0' are stored in the storage device 33 for each segment.

In this manner, the combinations of relative magnitudes of the three detection signals Hu0', Hv0', and Hw0' and their relative magnitudes with respect to the reference value in each segment are stored in the storage device 33, for one cycle of electrical angle.

Next, the process of joining the subdivision signals performed in Step S104 of FIG. 4 by the line segment joining unit 323 will be described in detail.

The line segment joining unit 323 sequentially joins the subdivision signals of the subdivision detection device 322. Here, the line segment joining unit 323 joins the subdivision signals in the same positive or negative direction of the digital value in accordance with the crossings or zero-crossing points, the relative magnitudes of the detection signals Hu0', Hv0', Hw0', and their relative magnitudes with respect to the reference value.

Specifically, for each segment, the line segment joining unit 323 extracts a detection signal (which is also referred to as an intermediate signal) that ranks in the middle (for example, the second largest (smallest) in the example of FIG. 13) in terms of relative magnitudes of the digital values of the detection signals Hu0', Hv0', Hw0'. The line segment joining unit 323 compares relative magnitudes between each of digital values of the extracted intermediate signals with a digital value of the detection signal at an immediately previous crossing or zero-crossing point (which is also referred to as a crosspoint signal value). Here, the immediately previous crossing or zero-crossing point is supposed to be immediately previous to the intermediate signal in a rotor angle direction, and corresponds to the crossing cp1 with respect to the subdivision signal sg101, or the zero-crossing point zc1 with respect to the subdivision signal sg102 in the example of FIG. 13, for example.

Considering the subdivision signal sg102, when it is determined that the digital value of the intermediate signal sg102 is equal to or greater than the immediately previous crosspoint signal value zc1, the line segment joining unit 323 adds a value, which is obtained by subtracting the immediately previous crosspoint signal value zc1 from the digital value of the intermediate signal sg102, to the immediately previous crosspoint signal value zc1. On the other hand, when it is determined that the digital value of the intermediate signal sg102 is smaller than the immediately previous crosspoint signal value zc1, the line segment joining unit 323 adds a value which is obtained by subtracting the digital value of the intermediate signal sg102 from the immediately previous crosspoint signal value zc1. The line segment joining unit 323 repeats this addition in ascending order from the smaller rotor angles. As a result, the line segment joining unit 323 can join the subdivision signals in the positive direction of digital values (see FIG. 14).

Note that the line segment joining unit 323 may add a difference, that is, an absolute value, between the digital value of the intermediate signal and the immediately previous crosspoint signal value.

Note that an end point of a subdivision signal sg112' corresponds to a mechanical angle of 60 [degM] since the motor M has the six pole pairs. An end point of a subdivision signal sg124' corresponds to a mechanical angle of 120 [degM]. An end point of a subdivision signal sg136' corresponds to a mechanical angle of 180 [degM]. An end point of a subdivision signal sg148' corresponds to a mechanical angle of 240 [degM]. An end point of a subdivision signal sg160' corresponds to a mechanical angle of 300 [degM]. An end point of a subdivision signal sg172' corresponds to a mechanical angle of 360 [degM].

A specific example of joining of the subdivision signals for one cycle of electrical angle performed by the line segment joining unit 323 will be described.

FIG. 14 is a view illustrating the joining of the subdivision signals for one cycle of electrical angle according to the present embodiment. FIG. 14 illustrates a view in which the subdivision signals sg101' to sg112' of the period E1 of FIG. 13 are joined. In FIG. 14, the horizontal axis represents a rotor angle [degE]. The vertical axis represents the digital value. In the example of FIG. 14, the rotor R performs the CW rotation. In FIG. 13, the subdivision signals sg101' to sg112' are signals obtained by joining the subdivision signals sg101 to sg112 of FIG. 13 by the line segment joining unit 323. Points p101 to p113 are points replacing the crossings cp1 to cp7 and the zero-crossing points zc1 to zc6 of FIG. 13. A curve g132 is a curve obtained by joining the subdivision signals sg101' to sg112'.

In the following description, the forward direction is a direction in which the digital value increases along with an increase of the rotor angle. The line segment joining unit 323 replaces the crossing cp1 with the point p101, for example. The line segment joining unit 323 joins the subdivision signal sg101' in the forward direction. Specifically, the line segment joining unit 323 replaces the subdivision signal sg101 in FIG. 13 with the subdivision signal sg101' having the point p101 as the start point and the point p102 as the end point. Further, the line segment joining unit 323 replaces the zero-crossing point zc1 with the point p102.

Further, the line segment joining unit 323 joins the subdivision signal sg102' in the forward direction. Specifically, the subdivision signal sg101 in FIG. 13 is replaced with the subdivision signal sg102' having the point p102 as the start point and the point p103 as the end point. Further, the line segment joining unit 323 replaces the crossing cp2 with the point p103.

As indicated by the curve g132 in FIG. 13, the line segment joining unit 323 sequentially joins the subdivision signals sg101' to sg112' illustrated in FIG. 13 in the forward direction. As a result, the crossing cp1 at the rotor angle θ101 is replaced with a digital value of zero. Further, the line segment joining unit 323 replaces the crossing cp7 at the rotor angle θ113 with a digital value of 1200. Note that the digital value of 12000 corresponds to 360 [degE] for one cycle of electrical angle in FIG. 13.

A specific example of the joining of the subdivision signals for one cycle of mechanical angle, which is the operation performed by the line segment joining unit 323, will be described with reference to FIG. 15.

In a first cycle E1, the line segment joining unit 323 sequentially joins the subdivision signals sg101 to sg112 of FIG. 13 for one cycle of electrical angle in the forward direction. As a result, the subdivision signals sg101 to sg112 of FIG. 13 are joined as indicated by the subdivision signals sg101' to sg112' of FIG. 13.

Next, in a second cycle E2, the line segment joining unit 323 joins the start point of the subdivision signal sg113' of the second cycle E2 with the end point of the subdivision signal sg112'. Subsequently, the line segment joining unit 323 joins the subdivision signals sg113 to sg124 for one cycle of electrical angle in the forward direction. As a result, the subdivision signals sg113 to sg124 are joined as indicated by the subdivision signals sg113' to sg124' of FIG. 15.

Hereinafter, the line segment joining unit 323 joins the start point of the subdivision signal sg125' of a third cycle E3 with the end point of the subdivision signal sg124' of the second cycle E2. Next, the line segment joining unit 323 joins the start point of the subdivision signal sg137' of a fourth cycle E4 with the end point of the subdivision signal sg136' of the third cycle E3. Next, the line segment joining unit 323 joins the start point of the subdivision signal sg149' of a fifth cycle E5 with the end point of the subdivision signal sg148' of the fourth cycle E4. Next, the line segment joining unit 323 joins the start point of the subdivision signal sg161' of a sixth cycle E6 with the end point of the subdivision signal sg160' of the fifth cycle E5.

FIG. 15 is a view illustrating an example of a result of joining the subdivision signals for one cycle of mechanical angle according to the present embodiment. As illustrated in FIG. 15, one cycle of electrical angle includes 12 subdivision signals. The first cycle E1 includes the subdivision signals sg101' to sg112'. The second cycle E2 includes the subdivision signals sg113' to sg124'. The third cycle E3 includes the subdivision signals sg125' to sg136'. The fourth cycle E4 includes the subdivision signals sg137' to sg148'. The fifth cycle E5 includes the subdivision signals sg149' to sg160'. The sixth cycle E6 includes the subdivision signals sg161' to sg172'.

Therefore, a cycle K1 for one cycle of mechanical angle includes the 72 subdivision signals sg101' to sg172'.

Next, the process of generating the mechanical angle in Step S105 performed by the position estimation device 30 will be described. Now the mechanical angle of any point in sg102' is considered. The mechanical angle position of sg102' is located in the period of E1 in FIG. 15, and an enlarged view of the period of E1 is illustrated in FIG. 14. The line segment joining unit 323 adds a value, obtained by subtracting the immediately previous crosspoint signal value zc1 from the digital value of the intermediate signal, to the immediately previous crosspoint signal value zc1. Further, the line segment joining unit 323 replaces the crosspoint signal value zc1 with the point p102 as described above. Then, the line segment joining unit 323 adds a value, obtained by subtracting the immediately previous crosspoint signal value zc1 from the digital value of the intermediate signal, to the point p102. The position estimation device 30 estimates the mechanical angle position of the rotor based on a length of line segments of the subdivision signals joined by the line segment joining unit 323.

A specific example of the information stored in the storage device 33 will be described.

The storage device 33 stores a relationship among the number of pole pairs, the section, and the segment. Further, the storage device 33 stores the relative magnitudes of the three detection signals Hu0', Hv0', and Hw0' for each section. The relative magnitudes of the three detection signals Hu0', Hv0', and Hw0' and their relative magnitudes with the reference values are used to determine the section number.

In the position estimation method of the present embodiment, a detection signal is divided into two segments with a zero-crossing point as a boundary. As a result, one round of mechanical angle has 72 subdivision signals. In the position estimation method of the present embodiment, a length of one subdivision signal is short. As a result, a combined subdivision signal is closer to a more ideal linear signal that is proportional to an angle. Further, in the position estimation method of the present embodiment, it is possible to obtain the position, which is the angle information, of the rotor R based on subdivision signals having shapes close to a straight line. Since the position estimation device 30 estimates the position of the rotor R using the line segments thus joined, it is possible to perform the highly precise position detection without requiring a high-precision optical encoder in the present embodiment.

The motor module 1000 can perform position control using the position estimation value $\hat{\Theta}$ obtained in this manner. In the position estimation method of the present embodiment, the detection device that detects the position of the rotor R does not need to use an encoder that is easily affected by an environment. As a result, the motor can be downsized, and the precision of position control is not easily affected by the environment such as dust. Further, the position estimation signal is not a discrete pulse signal, but is linearly changed in magnitude, and thus, the rotor (mover) can be positioned with an arbitrary level of resolution.

Note that the generation of the position estimation value is not limited to the above method. What is important is that the position estimation signal is not a discrete pulse signal but has a magnitude that linearly changes according to the position of the rotor R.

Although the example in which the crossing and zero-crossing point are detected, and the detection signal between the crossing and the zero-crossing point is detected as the subdivision signal has been described in the present embodiment, but the embodiment of the present disclosure is not limited thereto. For example, the subdivision detection device 322 may extract a detection signal from a crossing to a crossing adjacent to the crossing as a subdivision signal. Further, the subdivision detection device 322 may divide the extracted subdivision signal into two subdivision signals with a zero-crossing point between the crossing and the adjacent crossing as a boundary.

Although the example in which the position calculation unit 32 performs each process on the detection signals Hu0', Hv0', and Hw0' converted into the digital signals has been described in the present embodiment, but the embodiment of the present disclosure is not limited thereto. For example, the position calculation unit 32 may perform each process on the detection signals Hu0, Hv0, and Hw0 which are analog signals.

A scheme of driving the motor M may be, for example, a vector control method or another driving method. Another driving method may be, for example, a driving method using a 120-degree rectangular wave or sine wave.

The number of poles of the motor M is not limited to 12 poles, and may be, for example, two poles, four poles, eight poles, or the like. For example, in the case of an 8-pole motor, one cycle of one mechanical angle has four subdivision signals for one cycle of electrical angle. At this time, when the detection device outputs three-phased detection signals, one cycle of one electrical angle has 12 subdivision signals. Therefore, one cycle of mechanical angle includes 48 (=12×4) subdivision signals. In the case of the 8-pole motor, the line segment joining unit 323 may sequentially combine 48 subdivision signals in the forward direction for one cycle of mechanical angle when the rotor R performs the CW rotation.

When the rotor R performs CCW rotation, the line segment joining unit 323 may connect the subdivision signals for one cycle of mechanical angle in the backward direction in Step S104. Here, CCW is rotation in the counterclockwise direction as viewed from the output shaft side. Further, the backward direction is a direction in which the digital value decreases along with an increase of a rotor angle. The line segment joining unit 323 may sequentially join the joined subdivision signals for one cycle of mechanical angle in the descending direction from 360 [degM] to 0 [degM] along with the increase of the rotor angle. In this case, the position estimation device 30 determines whether the rotor R performs the CW rotation or CCW rotation when the relative magnitudes of the three detection signals Hu0', Hv0', and Hw0' stored in the storage device 33 change. According to the present embodiment, the position of the rotor R can be precisely estimated regardless of whether the rotor R performs the CW rotation or CCW rotation.

A relationship between the rotation direction and the detection signal will be described with reference to FIG. 13.

When there is a current position between the rotor angles θ105 and θ107, the position estimation device 30 stores, for example, a digital value on the vertical axis at the current position and a digital value on the vertical axis of the rotor angle θ105, which is the immediately previous crossing, in the storage device 33.

When the rotor R performs the CW rotation, the position of the rotor R moves between the rotor angles θ107 and θ109. The position estimation device 30 switches an intermediate signal from the detection signal Hv0' to the detection signal Hu0' and detects whether the intermediate signal after switching is positive or negative with respect to a reference value, and determines that the rotor R performs the CW rotation. Subsequently, the position estimation device 30 joins the subdivision signals sg107 and sg108 between the rotor angles θ107 and θ109 with the subdivision signal sg106 in the forward direction.

On the other hand, when the rotor R performs the CCW rotation, the position of the rotor R moves between the rotor angles θ103 and θ105. The position estimation device 30 switches an intermediate signal from the detection signal Hv0' to the detection signal Hw0' and detects whether the intermediate signal after switching is positive or negative with respect to a reference value, and determines that the rotor R performs the CCW rotation. Subsequently, the position estimation device 30 joins the subdivision signals sg103 and sg104 between the rotor angles θ103 and θ105 with the subdivision signal sg105 in the backward direction.

The sensor of the detection device 150 is not limited to the Hall element. The sensor used in the detection device 150 may produce detection signals which are sine waves, or output signals that contain harmonics in sine waves. For example, the sensor of the detection device 150 may be a sensor that utilizes magnetoresistance effect.

The subdivision detection device 322 may extract a subdivision signal by generating a line segment from a crossing to a zero-crossing point which is adjacent to the crossing, or from a zero-crossing point to a crossing which is adjacent to the zero-crossing point. The line segment may be a straight line, or a portion of a sine wave, for example.

The motor M is not limited to the outer rotor type, and may be a brushed motor whose slot forms a part of the rotor R. Furthermore, the motor M may be a linear motor as described above.

The number of sensors provided in the detection device 150 is not limited to three. The outputs from the respective sensors may be shifted by a phase obtained through division by the total number of sensors.

Further, the example in which the crossing position detection device 321 detects the crossing and zero-crossing point has been described in the present embodiment, but the present invention is not limited thereto. The crossing position detection device 321 may detect only the crossing. In this case, the subdivision detection device 322 may sequentially detect a part of the detection signal from a crossing to a crossing adjacent to the crossing as a subdivision signal. In this case, the number of subdivision signals for one cycle of electrical angle is six. Further, when the number of pole pairs of the motor M is six, the number of subdivision signals for one cycle of mechanical angle is 36.

When an optical encoder is used to detect a rotation position of the rotor R as in conventional techniques, the precision of detection depends on the resolution of the encoder. Here, the optical encoder, for example, has a photointerrupter and an encoder disk. The encoder disk has slits formed at equal intervals along the circumference. For example, detection precision of an encoder with a resolution of 400 pulses is about ±0.9 degrees.

In the present application, it suffices that the "detection" of the crossing position, the zero-crossing point, and the subdivision signal enables detection of the crossing position and the zero-crossing point as a result of calculating the crossing position, the zero-crossing point, and the subdivision signal in the position estimation device.

A program configured to implement the functions of the motor control device including the position estimation device may be recorded in a computer-readable storage medium (not illustrated), and the program recorded in this recording medium may be loaded to a computer system for execution to perform the steps of the respective processes. Note that the "computer system" described herein includes an OS and hardware such as peripherals. Further, the "computer-readable recording medium" refers to a portable medium such as a flexible disk, a magneto-optical disk, a memory card having a flash memory mounted thereon, and a CD-ROM, or a storage device such as a hard disk that is built in the computer system. Furthermore, the "computer-readable recording medium" encompasses those holding a program for a certain period of time such as a volatile memory (RAM) inside the computer system that serves as a server or a client when the program is transmitted via a network such as the Internet and a telecommunication line such as a telephone circuit.

The above program may be transmitted from a computer system having this program stored in a storage device or the like to another computer system via a transmission medium or by a propagating wave within a transmission medium. Here, the "transmission medium" through which the program is transmitted refers to a medium having a function of transmitting information such as a network (communications network) such as the Internet and a telecommunication line (communication line) such as a telephone circuit. Further, the above program may be configured to implement some of the functions described above. Furthermore, the above program may also be one that implements the above-described functions in combination with a program that is already recorded in a computer system, that is, a so-called difference file (difference program).

The motor control device 100 according to the present disclosure can be implemented using a signal processing circuit and a recording medium storing a computer program which controls the operation of this signal processing circuit. Hereinafter, such an embodiment will be described.

Figure 16:
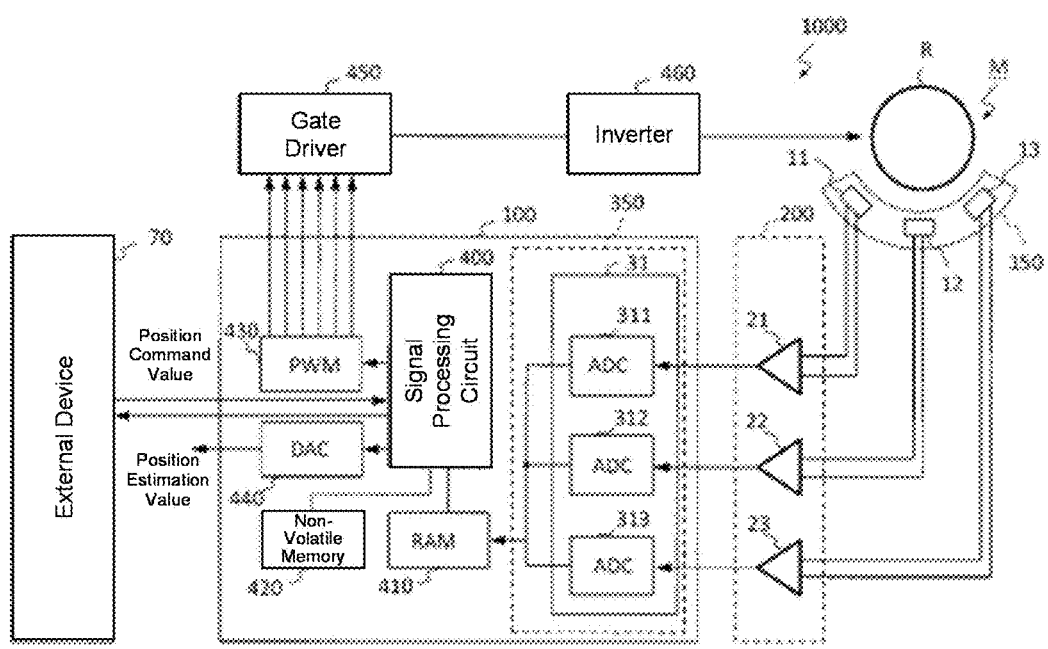
FIG. 16 is a schematic diagram illustrating another configuration example of the motor module 1000 according to the embodiment.

FIG. 16 is a schematic diagram illustrating another configuration example of the motor module 1000 according to the present embodiment. The motor module 1000 of the present embodiment includes the motor M, the detection device 150, the amplifier circuit 200, the motor control device 100, a gate driver 450, and an inverter 460 as illustrated in FIG. 16. The motor module 1000 receives an external signal such as a pulse signal from the external device (controller) 70, and controls an operation of the motor M based on this external signal. In the example illustrated in FIG. 16, the above-described motor control circuit 20 and position estimation device 30 are entirely or partially implemented by a signal processing circuit 400.

The detection device 150 includes N (N is an integer of three or more) sensors that detect a magnetic field formed by a plurality of magnetic poles of the rotor R and output detection signals each having a magnitude according to the intensity of the detected magnetic field. The N sensors are arranged such that phases of the N detection signals are shifted by an angle of 360 degrees/N. In the example illustrated, N is three, and the detection device 150 includes the sensors 11, 12, and 13. The configurations and operations of the motor M, the detection device 150, and the amplifier circuit 200 in the present embodiment are the same as those that have been already described, and thus, the detailed description thereof will not be repeated here.

The illustrated motor control device 100 includes a preprocessing circuit 350 that generates N corrected detection signals from N detection signals, and the signal processing circuit 400 that performs various kinds of signal processing. The signal processing circuit 400 according to the present embodiment may be an integrated circuit (IC) chip such as a central processing unit (CPU) and a digital signal processing processor. The motor control device 100 includes a recording medium storing a computer program that controls an operation of the signal processing circuit 400. This recording medium is a non-volatile memory 420 such as a flash ROM, and is connected to the signal processing circuit 400. The N corrected detection signals output from the preprocessing circuit 350 are stored in a RAM 410 as variables at any time.

The preprocessing circuit 350 has the AD converter 31 described above, and may have a circuit that performs processing such as correction and normalization on an output of the AD converter 31 as necessary. The detection signal is converted into a digital signal by the preprocessing circuit 350 and can be subjected to various correction processes. Here, the detection signal subjected to such preprocessing is referred to as a "corrected detection signal".

The signal processing circuit 400 functions as the position estimation device, and thus, executes the following steps according to commands of the computer program.

First, the signal processing circuit 400 reads the corrected detection signal from the RAM 410. Next, a crossing at which any two signals of the N corrected detection signals cross each other is sequentially detected.

The signal processing circuit 400 divides the corrected detection signal connecting a crossing and another crossing adjacent to the crossing into one or a plurality of segments, and detects each segment as a subdivision signal.

The signal processing circuit 400 reads learning data in which each movement amount of the rotor corresponding to each segment has been associated with all the segments, from a storage device. This storage device may be a recording medium that stores the computer program described above, or may be another storage device such as a memory card. In the present embodiment, the learning data is stored in the non-volatile memory 420, and the learning data is read from the non-volatile memory 420. This learning data is acquired by offline processing before shipment and is stored in a storage medium. The learning data can be updated after shipment.

The signal processing circuit 400 refers to this learning data to specify a segment corresponding to a current position of the rotor R based on a relationship between the N corrected detection signals, and the subdivision signal.

In one aspect, when i is an integer of one or more, n is an integer that defines a current time, a number of the specified segment is i, a position of the rotor R at a start point of the specified segment is $\Theta offset[i]$, a difference between a value of a subdivision signal at the start point of the segment and a current value of the subdivision signal is $X[n]$, a position estimation value of the rotor R is $\Theta[n]$, and a proportionality factor is $k[i]$, the relationship of $\Theta[n]=\Theta offset[i]+k[i]\times X[n]$ is established. From this relationship, the position estimation value of the rotor R is determined.

In this manner, the signal processing circuit 400 executes: dividing a first electrical signal output from a sensor device into a plurality of segments and detecting each segment as the subdivision signal; associating each rotation mechanical angle of the rotor corresponding to each segment with all the segments; and outputting a signal indicating the position estimation value of the rotor, the signal having a value that linearly increases in proportion to the rotation mechanical angle of the rotor from the reference position. The signal indicating the position estimation value of the rotor R has a value that linearly increases in proportion to the movement amount of the rotor R from the reference position. In a preferred aspect, the signal indicating the position estimation value of the rotor R has a digital value or analog value proportional to Θ.

The signal processing circuit 400 can measure a rotation time of the rotor for each segment when the rotor is rotating at a constant speed at the time of acquiring the learning data, and associate each rotation mechanical angle of the rotor corresponding to each segment with all the segments.

After reactivation of the power, information of Segment i is initialized. Therefore, it is necessary to specify a mechanical position (segment or pole pair number) of the rotor after reactivation of the power in order to use the proportionality factor k[i] obtained by learning the offline processing. The segment number or pole pair number are associated with each other by a relational expression, for example, segment number=12×pole pair number+section number. Therefore, the segment number (mechanical position) can be specified by specifying the pole pair number of the rotor after reactivation of the power using the position estimation method according to the present disclosure. That is, the section number is determined based on the relative magnitudes of the three detection signals Hu0', Hv0', and Hw0' and their relative magnitudes with respect to the reference values according to the present embodiment. Here, when the number of magnetic pole pairs is six, there are six subdivision signals having the same section number (having the same relative magnitudes of the three detection signals and relative magnitudes with respect to the reference values) among 72 subdivision signals. Here, the pole pair number of the initial position of the rotor is specified by the position estimation method of the present disclosure, and the sequence of the section numbers can be determined, and thus, one of the six subdivision signal candidates is specified.

In the present embodiment, the learning data includes data that associates each segment with the proportionality factor k[i]. The signal processing circuit 400 that functions as the position estimation device determines (specifies) the segment number i based on a relationship between an initial rotation position of the rotor when the first electrical signal is output at the time of acquiring the learning data and an initial rotation position of the rotor when the second electrical signal is output after reactivation of the power.

In this manner, the signal processing circuit 400 determines the position estimation value of the rotor from the level of the subdivision signal based on the specified segment, and generates the signal indicating the position estimation value.

As the operations executed by the signal processing circuit 400, reading the learning data in which each movement amount of the rotor corresponding to each segment has been associated with all the segments from the storage device, and specifying the segment corresponding to the current position of the rotor based on the relationship between the N corrected detection signals, and the subdivision signals with reference to the learning data are not indispensable operations for the present embodiment. Instead of performing these operations, the signal processing circuit 400 may determine a position estimation value of the rotor from levels of subdivision signals based on a plurality of joined subdivision signals obtained by sequentially joining the subdivision signals, and output a signal indicating the position estimation value.

Furthermore, when the signal processing circuit 400 functions as a position command value generation circuit, the signal processing circuit 400 first acquires variable step size information, which defines a displacement amount of rotor per pulse of a pulse signal input from an external device, from a memory according to a command of the computer program. Next, when receiving the pulse signal from the external device, a position command value is generated based on the position estimation value of the rotor obtained by the above method and the variable step size information.

The signal processing circuit 400 executes calculation necessary for known motor control such as vector control using the position command value generated in this manner, and applies a PWM signal from a PWM circuit 430 to the gate driver 450. The gate driver 450 opens and closes a switching transistor in the inverter 460 based on the PWM signal, and supplies required voltage and current to the motor M.

Note that a position estimation signal may be input to a feedback (F/B) terminal (not illustrated) of the external device 70 in a digital value. The position estimation signal may be output to the outside as serial data, or may be output after being converted into an analog value by a DA conversion circuit (DAC) 440. For example, at the time of maintenance, it is possible to compare the position command value and the position estimation value by observing a signal converted into an analog value with an oscilloscope.

The various processes performed by the signal processing circuit 400 are not necessarily executed by one IC chip. The plurality of arithmetic processing units or digital signal processors (DSPs) may share different processes executed by the respective functional blocks. Further, the signal processing circuit 400 of the present embodiment can also be implemented using a programmable logic device such as a field-programmable gate array (FPGA).

When the learning data is acquired or updated in the offline state, the signal processing circuit 400 causes the rotor R to move (rotate) at a constant speed according to a command from the computer program. Further, a moving (rotating) time of the rotor R for each segment is measured, and data that associates each movement amount (mechanical angle) of the rotor R corresponding to each segment with all the segments is created. The signal processing circuit 400 stores this data in the non-volatile memory 420 as the learning data.

The position estimation method and position estimation device of the present disclosure can be used in combination with a motor that is widely used in devices such as a printer, a scanner, a copier, and a multifunction machine. The motor module of the present disclosure can widely replace a stepping motor or a position sensor-equipped motor in these devices.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A position estimation device that is used by being connected to a motor, which includes: a rotor having a plurality of magnetic poles; a stator having a plurality of windings; and a sensor device outputting an electrical signal that periodically changes according to rotation of the rotor, the position estimation device comprising:
   a signal processing circuit; and
   a storage medium that stores learning data including a sequence of a plurality of measurement values which define a waveform characteristic of a first electrical signal output from the sensor device when the rotor is rotating, wherein the signal processing circuit executes:

acquiring a sequence of a plurality of detection values which define a waveform characteristic of a second electrical signal output from the sensor device when the rotor starts rotating from a stopped state; and performing matching between an increase/decrease pattern of the sequence of the plurality of measurement values and an increase/decrease pattern of the sequence of the plurality of detection values to estimate a relationship between a rotation position of the rotor when the first electrical signal is output and a rotation position of the rotor when the second electrical signal is output, the signal processing circuit further executes:

subdividing the first electrical signal output from the sensor device into a plurality of segments, and detecting each of the plurality of segments as a subdivision signal, associating rotation mechanical angles of the rotor corresponding to the respective segments with all the plurality of segments, and outputting a signal indicating a position estimation value of the rotor, the signal having a value that linearly increases in proportion to a rotation mechanical angle of the rotor from a reference position, where i is an integer that is equal to or larger than one, n is an integer that defines a current time, a number of the segment thus specified is i, a position of the rotor at a start point of the specified segment is $\Theta\text{offset}[i]$, a difference between a value of a subdivision signal at the start point of the segment and a current value of the subdivision signal is $\Delta X[n]$, the position estimation value of the rotor is $\Theta[n]$, and a proportionality factor is $k[i]$, a relationship of $\Theta[n]=\Theta\text{offset}[i]+k[i]\times X[n]$ is established, and the signal indicating the position estimation value of the rotor has a digital value or an analog value which are proportional to $\Theta$.

2. The position estimation device according to claim 1, wherein the sequence of the plurality of measurement values is an array of maximum values and/or minimum values of the first electrical signal output from the sensor device, and the sequence of the plurality of detection values is an array of maximum values and/or minimum values of the second electrical signal output from the sensor device.

3. The position estimation device according to claim 1, wherein the increase/decrease pattern of the sequence of the plurality of measurement values and the increase/decrease pattern of the sequence of the plurality of detection values are defined by a relative magnitude with respect to a reference value.

4. The position estimation device according to claim 3, wherein the increase/decrease pattern of the sequence of the plurality of measurement values is a sequence of signs indicating the relative magnitude with respect to the reference value of each of the plurality of measurement values acquired while the rotor starts rotating from a stopped state and rotates 360 degrees in terms of mechanical angle, and the increase/decrease pattern of the sequence of the plurality of detection values is a sequence of signs indicating the relative magnitude with respect to the reference value of each of the plurality of detection values acquired while the rotor starts rotating from the stopped state and rotates 360 degrees in terms of mechanical angle.

5. The position estimation device according to claim 3, wherein the reference value that defines the relative magnitude of the increase/decrease pattern of the sequence of the plurality of measurement values is any one value in the sequence of the plurality of measurement values, and the reference value that defines the relative magnitude of the increase/decrease pattern of the sequence of the plurality of detection values is any one value in the sequence of the plurality of detection values.

6. The position estimation device according to claim 1, wherein the sensor device includes a plurality of magnetic field sensor elements, and each of the plurality of magnetic field sensor elements detects a magnetic field formed by the magnetic pole of the rotor and generates an electrical signal having a magnitude in response to an intensity of the detected magnetic field.

7. The position estimation device according to claim 6, wherein both the first electrical signal and the second electrical signal are signals output from one common magnetic field sensor element or the plurality of magnetic field sensor elements included in the sensor device.

8. The position estimation device according to claim 1, wherein the sensor device includes a plurality of current sensor elements, and each of the plurality of current sensor elements detects a current flowing through the plurality of windings of the stator, and generates an electrical signal having a magnitude in response to an intensity of the detected current.

9. The position estimation device according to claim 8, wherein each of the first electrical signal and the second electrical signal is a signal output from one common current sensor element or the plurality of current sensor elements included in the sensor device.

10. The position estimation device according to claim 1, wherein the signal processing circuit measures a rotation time of the rotor for each of the plurality of segments when the rotor is rotating at a constant speed, and associates the rotation mechanical angles of the rotor corresponding to the respective segments with all the plurality of segments.

11. The position estimation device according to claim 1, wherein the learning data include data associating each of the plurality of segments with the proportionality factor $k[i]$, and the signal processing circuit determines the number i of the specified segment based on a relationship between an initial rotation position of the rotor when the first electrical signal is output and an initial rotation position of the rotor when the second electrical signal is output.

12. The position estimation device according to claim 1, wherein
the motor is controlled based on the signal indicating the position estimation value of the rotor.

13. A motor module comprising:
a motor that includes a rotor having a plurality of magnetic poles and a stator having a plurality of windings;
a sensor device that includes N sensor elements arranged such that phases are shifted by an angle of 360 degrees/ N, the N sensor elements being N sensors detecting magnetic fields formed by the plurality of magnetic poles and outputting an electrical signal having a magnitude in response to an intensity of each of the detected magnetic fields;
a signal processing circuit; and
a storage medium that stores learning data including a sequence of a plurality of measurement values which define a waveform characteristic of a first electrical signal output from the sensor device when the rotor is rotating,
wherein the signal processing circuit executes:
acquiring a sequence of a plurality of detection values which define a waveform characteristic of a second electrical signal output from the sensor device when the rotor starts rotating from a stopped state; and
performing matching between an increase/decrease pattern of the sequence of the plurality of detection values and an increase/decrease pattern of the sequence of the plurality of measurement values to estimate a relationship between an initial rotation position of the rotor when the first electrical signal is output and an initial rotation position of the rotor when the second electrical signal is output,
the signal processing circuit further executes:
subdividing the first electrical signal output from the sensor device into a plurality of segments, and detecting each of the plurality of segments as a subdivision signal,
associating rotation mechanical angles of the rotor corresponding to the respective segments with all the plurality of segments, and
outputting a signal indicating a position estimation value of the rotor, the signal having a value that linearly increases in proportion to a rotation mechanical angle of the rotor from a reference position,
where i is an integer that is equal to or larger than one,
n is an integer that defines a current time,
a number of the segment thus specified is i,
a position of the rotor at a start point of the specified segment is $\Theta$offset [i],
a difference between a value of a subdivision signal at the start point of the segment and a current value of the subdivision signal is $\Delta X[n]$,
the position estimation value of the rotor is $\Theta[n]$, and
a proportionality factor is $k[i]$,
a relationship of $\Theta[n]=\Theta\text{offset}[i]+k[i]\times X[n]$ is established, and
the signal indicating the position estimation value of the rotor has a digital value or an analog value which are proportional to $\Theta$.

14. The motor module according to claim 13, wherein
the motor is controlled based on the signal indicating the position estimation value of the rotor.

* * * * *